United States Patent
Lee et al.

(10) Patent No.: US 11,088,084 B2
(45) Date of Patent: Aug. 10, 2021

(54) ELECTROMAGNETIC SHIELDING METAL-INSULATOR-METAL CAPACITOR STRUCTURE

(71) Applicant: Taiwan Semiconductor Manufacturing Co., Ltd., Hsinchu (TW)

(72) Inventors: Hui Yu Lee, Hsin-Chu (TW); Chin-Chou Liu, Jhubei (TW); Cheng-Hung Yeh, Jhunan Township (TW); Fong-Yuan Chang, Hsin-Chu (TW); Po-Hsiang Huang, Tainan (TW); Yi-Kan Cheng, Taipei (TW); Ka Fai Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/863,934

(22) Filed: Apr. 30, 2020

(65) Prior Publication Data
US 2020/0258846 A1 Aug. 13, 2020

Related U.S. Application Data

(62) Division of application No. 16/043,355, filed on Jul. 24, 2018, now Pat. No. 10,665,550.
(Continued)

(51) Int. Cl.
*H01L 23/552* (2006.01)
*H01L 49/02* (2006.01)
(Continued)

(52) U.S. Cl.
CPC .......... *H01L 23/552* (2013.01); *G06F 30/392* (2020.01); *G06F 30/394* (2020.01);
(Continued)

(58) Field of Classification Search
CPC . H01L 23/552; H01L 28/60; H01L 23/49822; H01L 23/5223; H01L 27/0207;
(Continued)

(56) References Cited

U.S. PATENT DOCUMENTS

2013/0270675 A1  10/2013  Childs et al.
2019/0333983 A1* 10/2019  Rubin ............... H01L 28/40

* cited by examiner

*Primary Examiner* — David Vu
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor interposer device. The semiconductor interposer device includes a substrate and a first metallization layer formed on the substrate. A first dielectric layer is formed on the first metallization layer and a second metallization layer is formed on the substrate. A first conducting line is formed in the first metallization layer and second and third conducting lines are formed in the second metallization layer. A metal-insulator-metal (MIM) capacitor is formed in the first dielectric layer and over the first conducting line. The MIM capacitor includes (i) a top capacitor electrode in the first dielectric layer and electrically coupled to the second conducting line; (ii) a bottom capacitor electrode in the first dielectric layer and above the first conducting line, wherein the bottom capacitor electrode is configured to be electrically floating; and (iii) a second dielectric layer between the top and bottom capacitor electrodes.

20 Claims, 12 Drawing Sheets

Related U.S. Application Data

(60) Provisional application No. 62/698,730, filed on Jul. 16, 2018.

(51) Int. Cl.
| | |
|---|---|
| *H01L 23/498* | (2006.01) |
| *H01L 23/522* | (2006.01) |
| *G06F 30/392* | (2020.01) |
| *G06F 30/394* | (2020.01) |
| *G06F 30/398* | (2020.01) |
| *H01L 27/02* | (2006.01) |

(52) U.S. Cl.
CPC ...... *G06F 30/398* (2020.01); *H01L 23/49822* (2013.01); *H01L 23/5223* (2013.01); *H01L 28/60* (2013.01); *H01L 27/0207* (2013.01)

(58) Field of Classification Search
CPC .............. H01L 23/481; H01L 23/5225; H01L 2224/11; H01L 23/49816
See application file for complete search history.

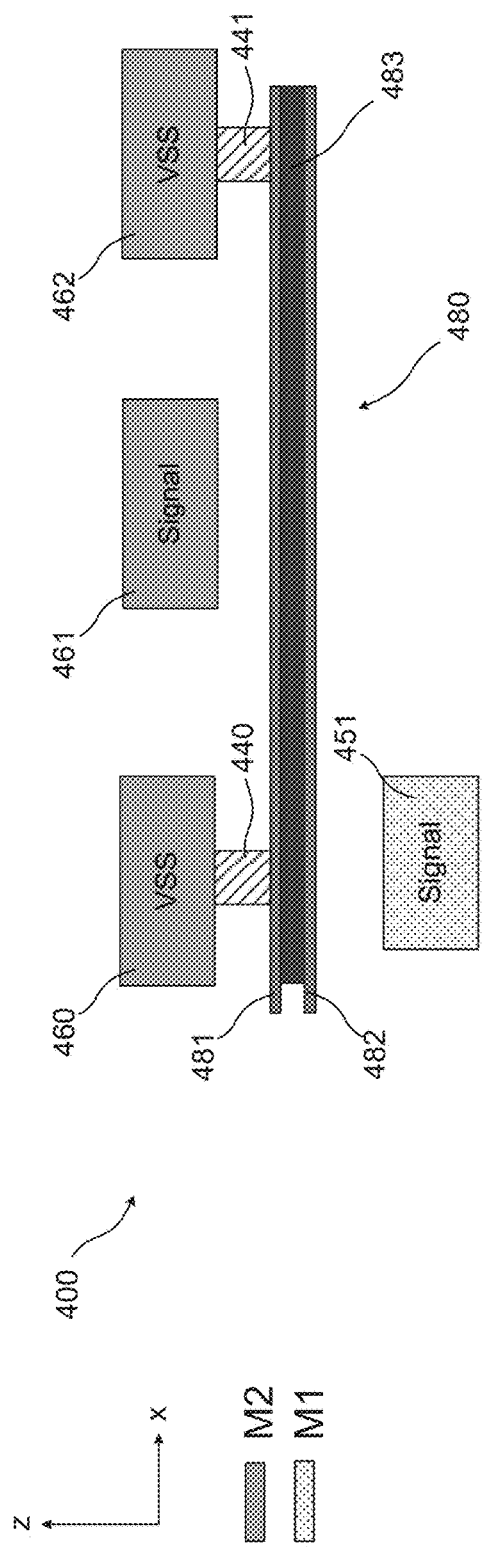
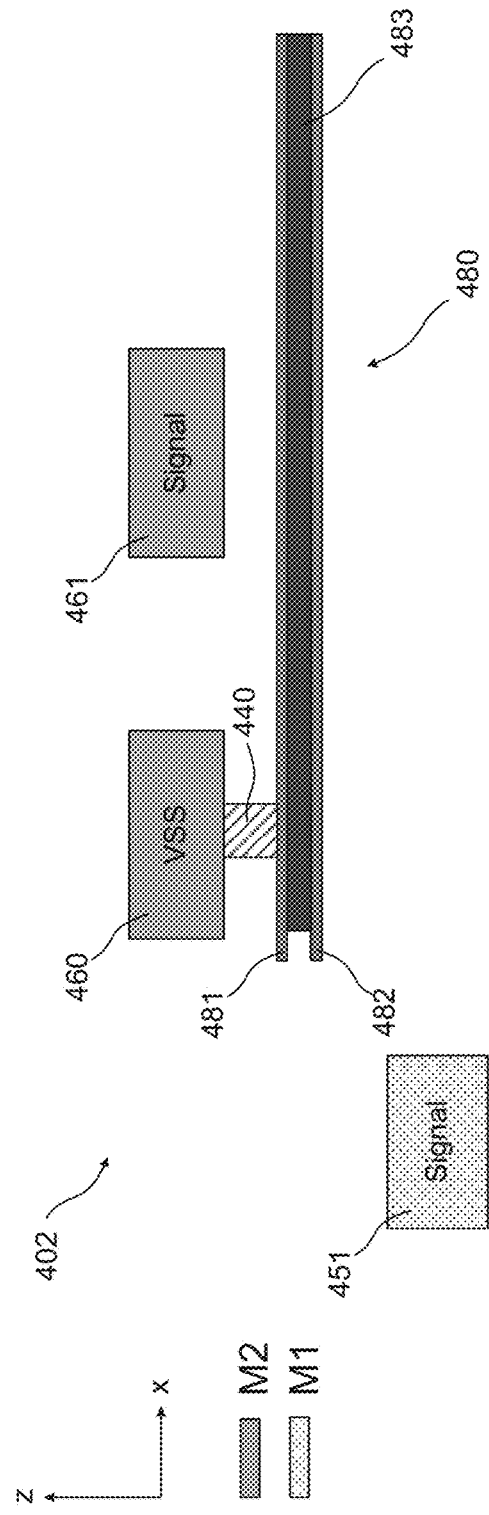

US 11,088,084 B2

ELECTROMAGNETIC SHIELDING METAL-INSULATOR-METAL CAPACITOR STRUCTURE

This application is a divisional of U.S. Non-provisional patent application Ser. No. 16/043,355, titled "Electromagnetic Shielding Metal-insulator-metal Capacitor Structure," which was filed on Jul. 24, 2018, which claims the benefit of U.S. Provisional Patent Application No. 62/698,730, titled "Electromagnetic Shielding Metal-insulator-metal Capacitor Structure," which was filed on Jul. 16, 2018, all of which are incorporated herein by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 3A-9B are various cross-sectional and isometric views of shielding MIM capacitor structures, in accordance with some embodiments.

DETAILED DESCRIPTION

Figure 1:
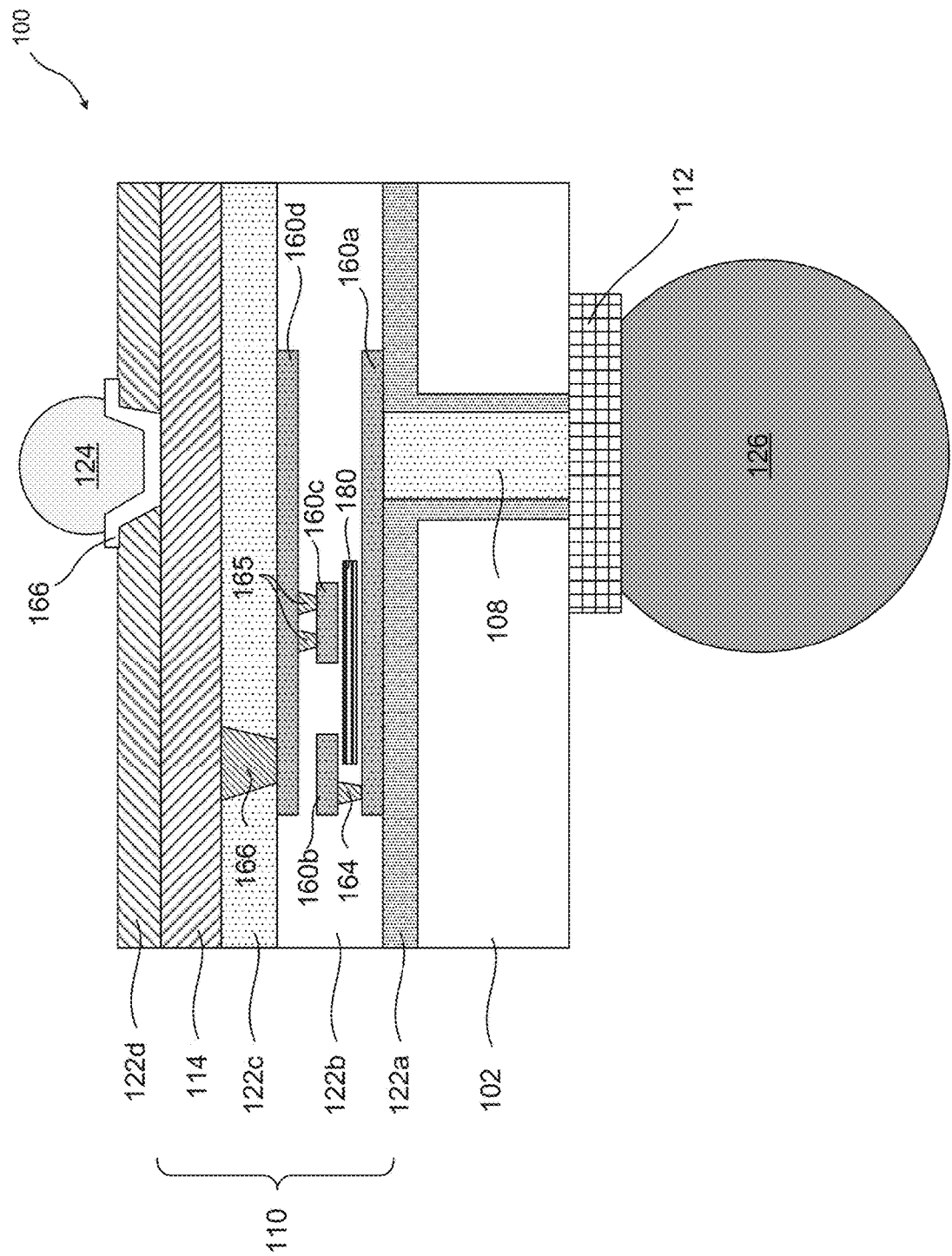
FIG. 1 is a cross-sectional view of an exemplary shielding MIM capacitor in an interposer structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Capacitors are elements that are used in semiconductor devices for storing electrical charges. Capacitors are used in, for example, filters, analog-to-digital converters, memory devices, control applications, and many other types of semiconductor devices. One type of capacitor is a metal-insulator-metal (MIM) capacitor. The MIM capacitor can be formed with two conductive plates in parallel and a dielectric layer sandwiched in between. MIM capacitor can be used as decoupling capacitors that are built into chips to prevent voltage spikes in a power supply such as, for example, when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Spike suppression performance can improve with decoupling capacitors that feature higher capacitance. In a chip fabrication process, decoupling capacitors can be integrated in the far back end of the line during or after packaging of the chip. Decoupling capacitors can be integrated into a three-dimensional ("3D") IC packaging such as, for example, a chip-on-wafer-on-substrate (CoWoS) chip package or an integrated fan-out (InFO) chip package. Decoupling capacitors formed as part of an interposer of a CoWoS and InFO chip package can have a MIM structure that includes a high dielectric constant (high-k) insulator (e.g., dielectric constant higher than 3.9).

IC packaging has evolved such that multiple ICs can be vertically stacked in the 3D packages in order to save horizontal area on a printed circuit board ("PCB"). An alternative packaging technique, referred to as a "2.5D package," can use an interposer structure, which may be formed from a semiconductor material, such as silicon, for coupling one or more semiconductor dies to a PCB. ICs or other semiconductor dies, which may incorporate heterogeneous technologies, can be mounted on the interposer. In addition to being joined to the IC dies, the interposer can also be joined to the PCB and to a package substrate disposed between the PCB and the interposer.

However, stacking multiple devices on one or more semiconductor dies can cause electrical noise and create electromagnetic ("EM") interference due to EM emissions from adjacent devices. RF devices and inductors are examples of devices which can create electrical noise and EM interference. In addition, electrical devices can also couple to power line structures and cause undesirable cross talk or cross coupling. Sources, such as an RF transmitter or receiver, generates electric noise in the form of EM emissions that can propagate through dielectric layers. Electrical noise carried in conductive structures, such as signal or power lines, can also propagate through the dielectric layers. A signal line can be connected to a signal source and transmit time-varying electrical signals (e.g., signals that change over time). In some embodiments, the signal lines can also be connected to a signal source that transmits a direct current (DC) signal. A power line can be connected to power sources and transmit power supply to various components of the circuit. The EM emissions and the electrical signals carried in the signal lines can impact various other signals and devices in a semiconductor device, other semiconductor dies coupled to the interposer, and other components in the semiconductor package. Noisy electrical signals and EM emissions therefore present challenges in semiconductor packaging.

Various embodiments in accordance with this disclosure provide mechanisms of forming a shielding metal-insulator-metal (MIM) capacitor structure to provide EM shielding for EM emissions in semiconductor devices. According to the present disclosure, the shielding MIM capacitor can mitigate power line ripple (e.g., current fluctuations) or decouple one circuit component from another circuit component of an electrical circuit structure, such as interposer structure. Shielding MIM capacitors can include parallel conductive plates that can act as Faraday shields to shield devices and structures from EM emission source and prevents EM interference in other circuit components, such as devices formed on another die or other components coupled to the interposer structure. Without using additional mask layers, the shielding MIM capacitor structure can be incorporated into decoupling capacitors for power/ground supplies to eliminate routing penalty and minimize device footprint. In accordance with some embodiments of this disclosure, the shielding MIM capacitor structure provides, among other things, benefits of: (i) improved power, performance, area (PPA) design by strategically placing shielding MIM capacitors between metal layers to serve as shielding capacitors, decoupling capacitors, or both; (ii) compatibility with current layout design and process flow without the need for additional masks; and (iii) diverse EM shielding protection in the vertical direction for upper/lower layers and horizontal direction for adjacent structures.

FIG. 1 illustrates a cross-sectional view of an interposer 100 incorporating a shielding MIM capacitor structure, in accordance with embodiments of the present disclosure.

Interposer 100 includes a substrate 102, and a contact pad 112 disposed on substrate 102. A through-silicon via (TSV) 108 formed in substrate 102 is electrically coupled to contact pad 112. Though one contact pad 112 is shown in FIG. 1, in accordance with embodiments of the present disclosure, more than one contact pad 112 can be formed over a surface of substrate 102. For example, there may be dozens or hundreds of contact pads 112 and TSVs 108 formed on the surface of substrate 102, depending on the application and size of an integrated circuit die.

Substrate 102 can be a silicon substrate, according to some embodiments. In some embodiments, substrate 102 can be (i) another semiconductor, such as germanium; (ii) a compound semiconductor; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material. Alternatively, substrate 102 can be formed of a dielectric material. In some embodiments, substrate 102 can be substantially free from integrated circuit devices, including active devices, such as transistors and diodes. In some embodiments, substrate 102 can include, or can be free from, passive devices, such as capacitors, resistors, inductors, and/or the like.

Contact pad 112 can be formed on a surface of substrate 102 using subtractive etching, direct etching, damascene lithography techniques, and/or any other suitable technique. Contact pad 112 can be formed of a metal adapted to be coupled to a bump 126. Bump 126 is formed on and electrically connected to contract pad 112. Bump 126 can include solder bumps, such as eutectic solder bumps. Alternatively, bump 126 can be formed of copper bumps or other metal bumps formed of gold, silver, nickel, tungsten, aluminum, other metals, and/or alloys thereof. Bump 126 can also include Controlled Collapse Chip Connection (C4) bumps used in semiconductor interconnection techniques such as flip chip interconnections. In some embodiments, bump 126 can protrude from the surface of substrate 102, as shown in FIG. 1. A solder mask (not shown) can be formed before the formation of the bump 126 to protect the bump material from forming in undesired regions.

TSV 108 is formed on substrate 102 by extending through substrate 102, as shown in FIG. 1. TSV 108 is formed of conductive materials such as a metal, a semiconductor material such as silicon, or combinations or multiple layers thereof, for example.

An interconnect structure 110 is formed over substrate 102 and includes one or more insulating material layers 122a, 122b, 122c, conductive lines 160a, 160b, and 160c, via 164 formed in insulating material layer 122c, and shielding MIM capacitor structure 180 formed between conductive lines 160a and 160b. For simplicity, other insulating material layers, conductive lines, vias, and/or capacitor structures are not illustrated in FIG. 1. The various layers of interconnect structure 110 can be formed using etching, direct etching, damascene lithography techniques, any suitable technique, and/or combinations thereof.

Insulating material layers 122a, 122b, 122c can be intermetallic dielectric layers used to provide electrical insulation between interconnect conductive lines in interposer structure 100. Insulating material layers 122a, 122b, 122c can be formed of dielectric materials such as, for example, silicon oxide, undoped silica glass, fluorinated silica glass, other suitable materials, and/or combinations thereof. In some embodiments, insulating material layers 122a, 122b, 122c are formed using a low-k dielectric material (e.g., material with a dielectric constant less than 3.9). In some embodiments, insulating material layer 122b can include two or more insulating material layers, which are not shown in FIG. 1 for simplicity. For example, each conductive line can be formed in a dielectric layer within insulating material layer 122b. In some embodiments, insulating material layer 122d can be a patterned passivation layer.

Interconnect structure 110 includes one or more conductive lines that are electrically coupled to each other or other devices through vias formed in insulating material layers. For example, conductive lines 160a, 160b, 160c, and 160d are formed in insulating material layer 122b and in metallization layers of interposer structure 110. In some embodiments, conductive line 160a can be formed in an M1 metallization layer, conductive lines 160b and 160c can be formed in an M2 metallization layer, and conductive line 160d can be formed in an M3 metallization layer. Alternatively, conductive lines 160a, 160b, 160c, and 160d can be formed in other metallization layers of interposer structure 100. Vias 164-166 are formed within insulating material layers and are electrically coupled to conductive lines 160a-160d. For example, via 164 can be formed in a Via1 layer of insulating material layer 122b and is electrically coupled to conductive lines 160a and 160b. Vias 165 can be formed in Via2 layer of insulating layer 122b and are electrically coupled to conductive lines 160c and 160d. In some embodiments, vias 164-166 can be formed using aluminum, aluminum alloy, copper, cobalt, any suitable metals, and/or combinations thereof. In some embodiments, interposer structure 100 can further include other conductive lines or vias and are not illustrated in FIG. 1 for simplicity. In some embodiments, there may be dozens or hundreds of contact vias and conductive lines formed within insulating material layer 122b, depending on the application and size of an integrated circuit die.

Shielding MIM capacitor 180 can be placed in insulating material layer 122b for providing EM shielding between conductive structures and devices. In addition, shielding MIM capacitor can be configured to serve as decoupling capacitors for power/ground lines within interposer structure 100. Therefore, without using additional mask layers, the shielding MIM capacitor structure can be incorporated into decoupling capacitors for power/ground supplies to reduce routing penalty and minimize the device footprint. To provide EM shielding between conductive lines formed in the M1 metallization layer, shielding MIM capacitor 180 can be placed between conductive lines 160a and 160b and also extend between conductive lines 160a and 160c. Shielding MIM capacitor 180 can be a parallel plate capacitor that includes a top metal plate (e.g., top capacitor electrode), a bottom metal plate (e.g., bottom capacitor electrode), and a dielectric layer in between. The detailed structure of shielding MIM capacitor 180 is not illustrated in detail in FIG. 1 but is described in detail in FIGS. 2-9B. To also serve as decoupling capacitor for power/ground lines or other conductive lines within interposer structure 100, shielding MIM capacitor 180 can be coupled to the conductive structures using through vias. For simplicity, the vias connected to shielding MIM capacitor 180 are not illustrated in FIG. 1 but described in detail in FIGS. 2-9B. In some embodiments, shielding MIM capacitors can be formed between other metallization layers such as, for example, M3, M4, M5 . . . etc. In some embodiments, shielding MIM capacitor 180 is formed in a dielectric layer within insulating material layer 122b.

A redistribution layer (RDL) can be formed on insulating material layer 122c. RDL 114 can include fan-out regions (not shown) for fanning-out the exterior connections of an integrated circuit die to a larger footprint on substrate 102. In some embodiments, RDL 114 can be formed using any suitable materials such as, for example, aluminum, aluminum alloy, or other metals. In some embodiments. RDL 114 can further include fuses.

An optional under-ball metallization (UBM) structure 166 can be formed in insulating material layer 122d and on RDL layer 114. UBM 166 can include conductive lines containing metal material to facilitate the formation of bump 124.

Bump 124 can be formed in a peripheral region of interposer structure 100 and can include micro-bumps, according to some embodiments. Each bump 124 can include an optional metal stud (not shown) that can be formed using copper, a copper alloy, or other metals. Bump 124 can alternatively comprise other materials. The metal studs of bump 124 can be formed of any suitable conductive material such as, for example, copper, nickel, platinum, aluminum, and/or combinations thereof. Metal stud and bump 124 can be formed through any number of suitable techniques, including physical vapor deposition (PVD), chemical vapor deposition (CVD), electrochemical deposition (ECD), molecular beam epitaxy (MBE), atomic layer deposition (ALD), electroplating, and the like. An optional conductive cap layer can be formed between the metal stud and the solder of the bump 124, also not shown for simplicity. For example, in an embodiment in which the metal stud is formed of copper, a conductive cap layer formed of nickel may be formed. Other materials, such as platinum, gold, silver, combinations thereof, or the like, may also be used for the optional conductive cap layer of bump 124.

Figure 2:
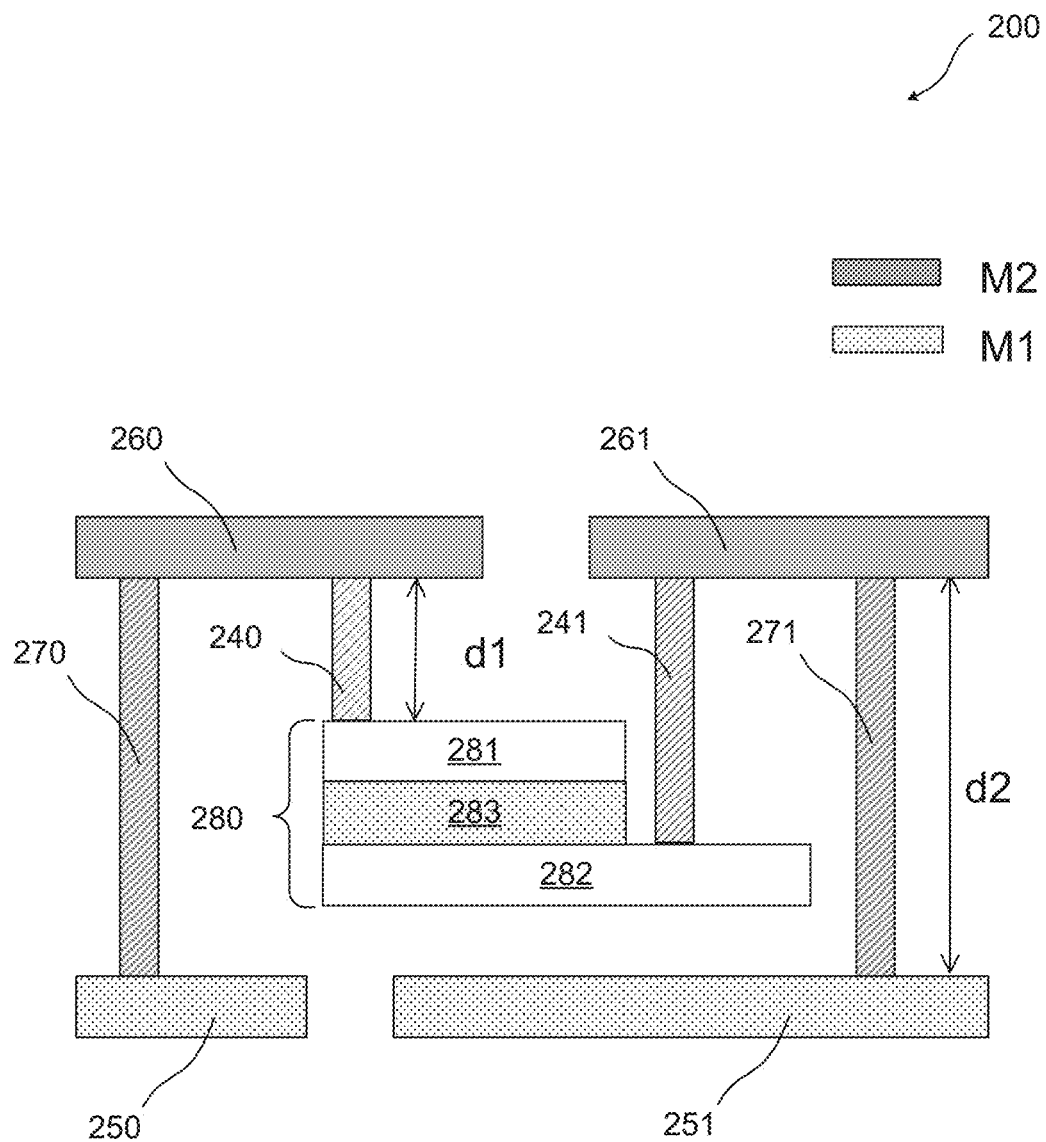
FIG. 2 is a cross-sectional view of an exemplary shielding MIM capacitor structure, in accordance with some embodiments.

FIG. 2 is a cross-sectional view of exemplary shielding MIM capacitor structures formed in an interposer structure 200, in accordance with some embodiments of the present disclosure. As shown in FIG. 2, conductive lines 250 and 251 can be conductive lines formed in an M1 metallization layer and conductive lines 260 and 261 can be formed in an M2 metallization layer of an interposer structure such as interposer structure 100 described above in FIG. 1. Shielding MIM capacitor structure 280 can include a top capacitor electrode 281, a bottom capacitor electrode 282, and a dielectric layer 283 formed in between. Top capacitor electrode 281 can be electrically connected to conductive line 260 through via 240, while bottom capacitor electrode 282 can be electrically connected to conductive line 261 through via 241. Similarly, conductive lines 250 and 260 can be electrically connected together by via 270 while conductive lines 251 and 261 can be electrically connected by via 271. Vias 240, 241, 270, and 271 can be formed in one or more insulating material layers (not shown) formed between the M1 and M2 metallization layers. In some embodiments, a distance d2 between adjacent metallization layers (e.g., M1 and M2) can be between about 0.5 μm and about 0.8 μm (e.g., 0.5 μm and 0.8 μm). In some embodiments, a distance d1 between top capacitor electrode 281 and conductive line 260 can be between 0.1 μm and 0.7 μm (e.g., 0.1 μm and 0.7 μm). A smaller distance d1 can provide reduced EM interference as the metal plane is brought closer in distance to the conducting line and therefore absorbs an increased amount of EM emissions. Other structures of interposer structures, such as other contact pads, insulating material layers, solder bumps, vias, conductive lines, etc., are omitted from FIG. 2 for simplicity.

In some embodiments, conductive lines 260 and 261 can be electrically connected to the same voltage level such as, for example, $V_{SS}$ (e.g., ground voltage reference) or $V_{DD}$ (e.g., source power) of integrated circuit power supply lines. In such scenario, shielding MIM capacitor serves as a Faraday shield that absorbs EM emission or powerline ripples and provides optimal shielding capacity. In some embodiments, conductive lines 260 and 261 can be connected to different voltage levels. For example, conductive line 260 is connected to $V_{DD}$ while conductive line 261 is connected to $V_{SS}$. In such scenario, shielding MIM capacitor not only serves as a Faraday shield for providing EM shielding but also acts as a decoupling capacitor for conductive lines 260 and 261.

Shielding MIM capacitor 280 includes top capacitor electrode 281, bottom capacitor electrode 282, and dielectric layer 283 formed in between the two capacitor electrodes. In some embodiments, top capacitor electrode 281 is formed from an aluminum copper alloy. In some embodiments, top capacitor electrode 281 can be formed from other conductive materials such as, for example, tantalum nitride, aluminum, copper, tungsten, metal silicides, other suitable metal or metal alloys, and/or combinations thereof. In some embodiments, top capacitor electrode 281 can include more than one layer. In some embodiments, a thickness of top electrode layer 281 can be in a range from about 200 Å to about 10000 Å (e.g., 200 Å to 10000 Å).

Dielectric layer 283 is disposed between top capacitor electrode 281 and bottom capacitor electrode 282. Dielectric layer 283 can be formed from a high-k dielectric material (e.g., material with a dielectric constant greater than 3.9). In some embodiments, dielectric layer 283 can be formed of any suitable dielectric material such as, for example, silicon nitride ($SiN_x$). Other suitable dielectric material can be used such as, for example, silicon oxide ($SiO_x$), hafnium oxide ($HfO_2$), other suitable dielectric material, and/or combinations thereof. In some embodiments, dielectric layer 283 can include one or more layers. Capacitances of parallel plate capacitors are inversely proportional to the dielectric layer thickness, thus the thickness of dielectric layer 283 can be selected to achieve a nominal capacitance. In some embodiments, a thickness of dielectric layer 283 can be in a range from about 0.2 μm to about 0.8 μm (e.g., 0.2 μm to 0.8 μm).

Bottom capacitor electrode 282 is disposed under dielectric layer 283. In some embodiments, bottom capacitor electrode 282 can be formed using the same material as top capacitor electrode 281. In some embodiments, bottom capacitor electrode 283 can be formed using a different material. In some embodiments, a thickness of bottom capacitor electrode 282 can be in a range from about 200 Å to about 10000 Å (e.g., 200 Å to 10000 Å).

Figure 3A:
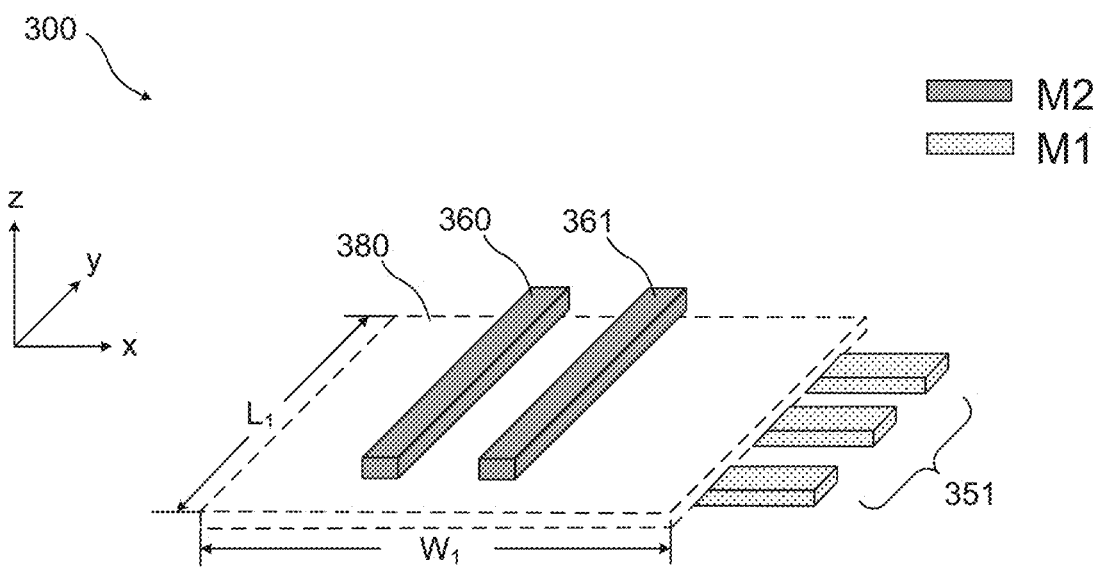
Figure 3B:
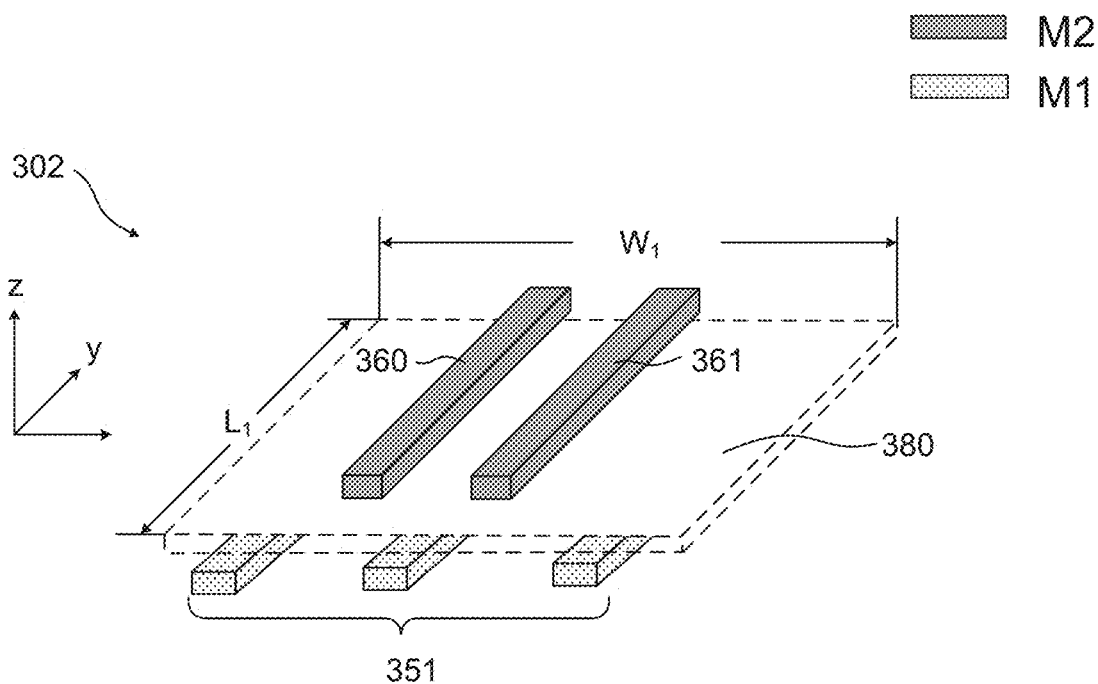

FIGS. 3A and 3B are isometric views of an exemplary shielding MIM capacitor structure 380 formed in an interposer structure, in accordance with some embodiments of the present disclosure. FIG. 3A illustrates a shielding MIM capacitor structure 380 formed between a pair of conductive lines 360 and 361 formed in a metallization layer (e.g., an M2 metallization layer) and a plurality of conductive lines 351 formed in an adjacent metallization layer (e.g., an M1 metallization layer). Conductive lines 351, 360, and 361 can be similar to conductive lines 251, 260, and 261 of FIG. 2, respectively. In some embodiments, conductive lines 351, 360, and 361 can be power supply lines, signal lines, circuitry of other suitable EM emitting devices, or combinations thereof. Because shielding MIM capacitor 380 can be configured to provide EM shielding between adjacent metallization layers, conductive lines from different metallization layers can be placed over one (e.g., directly over) another without creating cross talk or undesirable coupling. For example, conductive lines 360 and 361 can be placed above conductive lines 351 without introducing vertical cross talk between the conductive lines. As shown in FIG. 3A, conductive lines 360 and 361 are perpendicular to conductive lines 351. In some embodiments, conductive lines 360 and 361 can be parallel to conductive lines 351, as shown in FIG. 3B. Detailed structures of shielding MIM capacitor 380 such as top and bottom electrodes and dielectric layer are not illustrated in FIG. 3A or 3B for simplicity. Similarly, other structures of interposer structures, such as other contact pads, insulating material layers, solder bumps, vias, conductive lines, etc., are omitted from FIGS. 3A and 3B for simplicity.

The dimensions of shielding MIM capacitor 380 can be determined by a variety of factors. First, a capacitance of shielding MIM capacitor 380 is generally determined by its horizontal and vertical dimensions. For example, capacitance of a parallel plate shielding MIM capacitor 380 can be determined by parameters such as, for example, dielectric constant of the dielectric material, capacitor plate dimensions, and capacitor plate separation. The capacitance of shielding MIM capacitor 380 can become important when the shielding MIM capacitor is also used as a decoupling capacitor. Second, one of the factors that affect shielding capability of a shielding MIM capacitor is capacitor surface area, where a greater capacitor surface area can provide greater EM shielding capability. Therefore, dimensions and locations of shielding MIM capacitor 380 is crucial and depend on device needs. In some embodiments, a width $W_1$ of shielding MIM capacitor 380 in the x direction can be in a range from about 0.5 μm to about 200 μm (e.g., 0.5 μm to 200 μm). In some embodiments, a length $L_1$ of shielding MIM capacitor 380 in the y direction can be in a range from about 0.5 μm to about 200 μm (e.g., 0.5 μm to 200 μm). In some embodiments, the thickness of top or bottom capacitor electrodes (not shown) of shielding MIM capacitor 380 can be in a range from about 200 Å to about 10000 Å (e.g., 200 Å to 10000 Å).

FIGS. 4-9B are cross-sectional views of various exemplary shielding MIM capacitor structure configurations formed in semiconductor structures, in accordance with some embodiments of the present disclosure. Various configurations of top and bottom capacitor electrodes of shielding MIM capacitors can provide flexibility for shielding different portions of the semiconductor structure as required by device needs. For example, voltage biases of the top and bottom capacitor electrodes can be respectively set to various configurations to accommodate device needs: (i) $V_{SS}$ and $V_{SS}$; (ii) $V_{SS}$ and electrically floating (e.g., by not being directly connected to an electric potential); (iii) $V_{SS}$ and $V_{DD}$; (iv) $V_{DD}$ and $V_{SS}$; (v) electrically floating and $V_{SS}$; and any other suitable configurations. Conductive lines in these figures are formed in M1 or M2 metallization layers of interposer structures, but it should be understood that conductive lines can also be formed in other metallization layers of suitable semiconductor devices. Other structures of interposer structures, such as other contact pads, insulating material layers, solder bumps, vias, conductive lines, etc., are omitted from FIGS. 4-9B for simplicity.

FIGS. 4A-4B are cross-sectional views of exemplary shielding MIM capacitor structures formed in semiconductor structures 400 and 402, respectively, in accordance with some embodiments of the present disclosure. FIGS. 4A-4B illustrate a configuration of shielding MIM capacitor structure where it provides improved EM shielding for upper level metallization layers in an interposer structure. It should be noted that the configuration can also be applied to other suitable semiconductor structures where EM shielding for upper metallization layers are desired.

FIG. 4A illustrates a semiconductor structure 400 which includes: conductive line 451 formed in a first metallization layer (e.g., M1 metallization layer of an interposer structure); conductive lines 460, 461, and 462 formed in a second metallization layer (e.g., M2 metallization layer of the interposer structure); shielding MIM capacitor structure 480 including a top capacitor electrode 481, a bottom capacitor electrode 482, and a dielectric layer 483 formed between the two capacitor electrodes; and vias 440 and 441 between conductive layers 460 and 462 and top capacitor electrode 481. In some embodiments, conductive layers 460 and 462 can be electrically connected to $V_{SS}$, and as a result, top capacitor electrode 481 is connected to the ground voltage reference of the integrated circuit. In this scenario, shielding MIM capacitor 480's top and bottom capacitor electrodes are biased to the "$V_{SS}$/electrically floating" configuration. In some embodiments, conductive lines 451 and 461 can be EM signals emitting lines formed in M1 and M2 metallization layers, respectively. In some embodiments, conductive lines can be connected to signal sources and transmit time-varying signals. In some embodiments, conductive lines 451 and 461 can be power lines electrically connected to $V_{DD}$ of the integrated circuit. The Shielding MIM capacitor 480 can prevent cross talk (e.g., EM interference) between conductive lines 451 and 461 by, for example, blocking and absorbing EM signals emitted from conductive line 461. For example, top capacitor electrode 481 which is closer in distance to conductive line 461 rather than to conductive line 451, is electrically biased to ground reference which provides optimum EM shielding and absorbing capability in the vertical direction (e.g., z direction). In addition, conductive lines 460 and 462 provide EM shielding and absorbing capability in the horizontal directions (e.g., x direction). For example, conductive lines 460 and 462 can both be set to $V_{SS}$ which absorbs and blocks EM signals propagating in the −x and x directions. As a result, EM signals emitted by conductive line 461 can be absorbed and blocked by the conductive lines and shielding MIM capacitor 480.

FIG. 4B illustrates a semiconductor structure 402 which includes similar structures as described above in FIG. 4A. Similar structures are labelled using the same numerals and are not described in detail. In some embodiments, conductive line 462 and via 441 can be omitted (as shown in FIG. 4B) if the device design rules emphasize eliminating cross talk between conductive lines 451 and 461. As conductive lines 451 and 462 are on opposite sides of conductive line 461, EM signals traveling in the x direction that can reach conductive line 451 is minimal. To minimize device footprint and lower cost, conductive line 462 and via 441 can be omitted.

Figure 5:
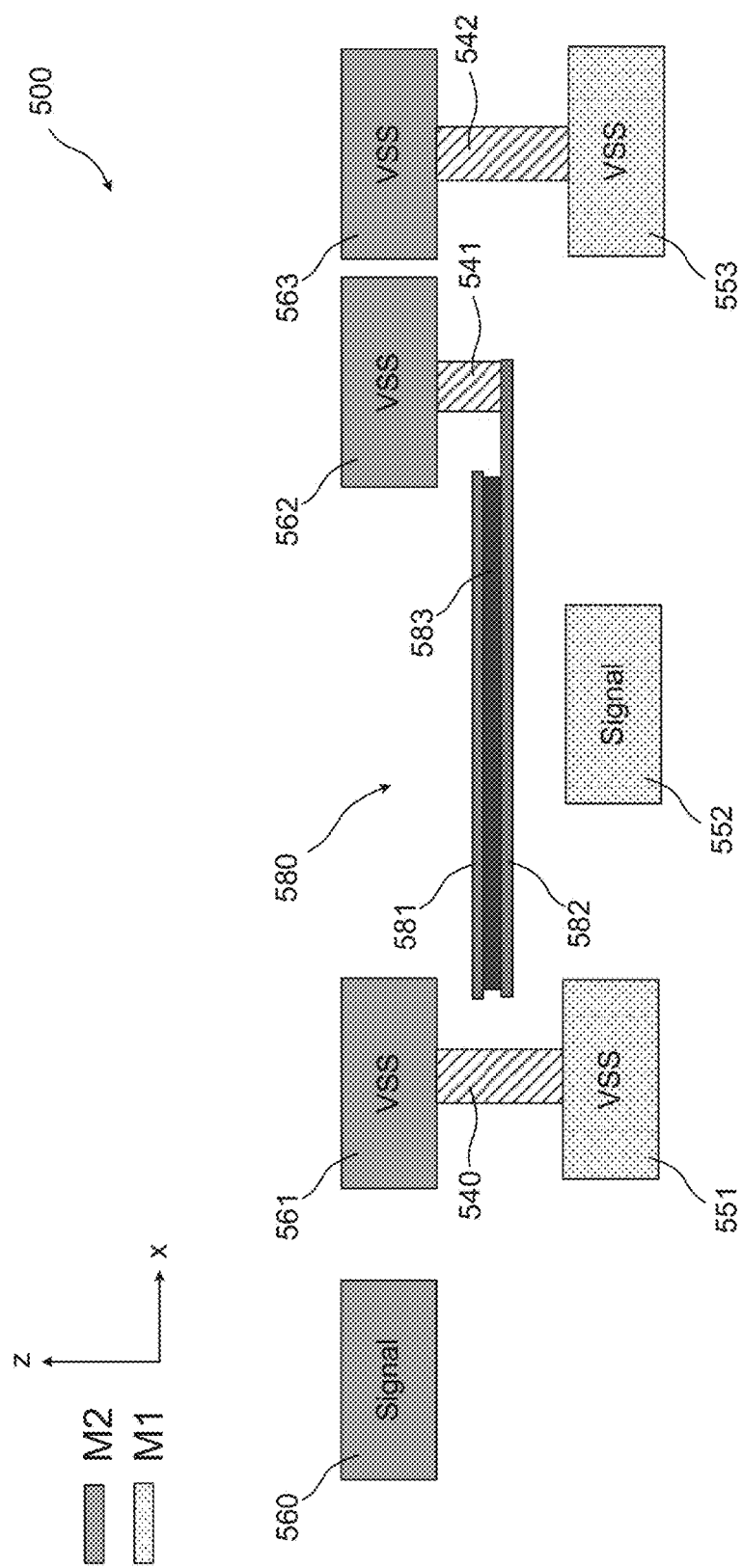

FIG. 5 illustrates a semiconductor structure 500 which includes a configuration of a shielding MIM capacitor 580 for improved EM shielding in lower level metallization layers of an interposer structure. Shielding MIM capacitor 580 can be applied to other suitable semiconductor structures where EM shielding for upper and/or lower metallization layers are desired. Semiconductor structure 500 includes: conductive lines 551, 552, and 553 formed in a first metallization layer (e.g., M1 metallization layer of an interposer structure); conductive lines 560, 561, 562, and 563 formed in a second metallization layer (e.g., M2 metallization layer of an interposer structure), shielding MIM capacitor structure 580 including a top capacitor electrode 581, a bottom capacitor electrode 582, and a dielectric layer 583 formed between the two capacitor electrodes; and vias 540, 541, and 542. Via 540 forms an electrical connection between conductive lines 551 and 561. Via 542 forms an electrical connection between conductive lines 553 and 563. As a result, conductive lines 551 and 561 are biased to the same voltage level, while conductive lines 553 and 563 are biased to the same voltage level. For example, conductive lines 551, 561, 553, and 563, can be biased to $V_{SS}$. In some embodiments, conductive line 562 can also be biased to $V_{SS}$. In this scenario, shielding MIM capacitor's top and bottom capacitor electrodes are biased to the "electrically floating/$V_{SS}$" configuration. In some embodiments, conductive lines 552 and 560 can be EM signal emitting signal lines formed in M1 and M2 metallization layers, respectively. In some embodiments, conductive lines can be connected to signal sources and transmit time-varying signals. In some embodiments, conductive lines 552 and 560 can be power lines that are electrically connected to $V_{DD}$ of the integrated circuit.

Shielding MIM capacitor structure 580 can prevent cross talk (e.g., EM interference) between conductive lines 552 and 560 by blocking and absorbing EM signals emitted from conductive line 552. For example, bottom capacitor electrode 582 which is closer in distance to conductive line 552, rather than to conductive line 560, is electrically biased to ground reference (e.g., $V_{SS}$) which provides optimum shielding and absorbing capability in the vertical direction (e.g., z direction). In addition, conductive lines 561 and 551, as well as conductive lines 553 and 563, provide EM shielding and absorbing capability in the horizontal directions (e.g., x direction). For example, conductive lines 551, 561, 553, and 563 can all be set to $V_{SS}$ which absorbs and blocks EM signals propagating in the −x and x directions. As a result, EM signals emitted by conductive line 552 can be absorbed and blocked by the conductive lines and shielding MIM capacitor. Similar to semiconductor structure 402 described above in FIG. 4B, as conductive lines 560 and 553 are on opposite sides of conductive line 552, EM signals traveling in the x direction that can reach conductive line 560 is minimal. To minimize device footprint and lower cost, conductive lines 553, 563, and via 542 can be omitted, according to some embodiments.

Figure 6:
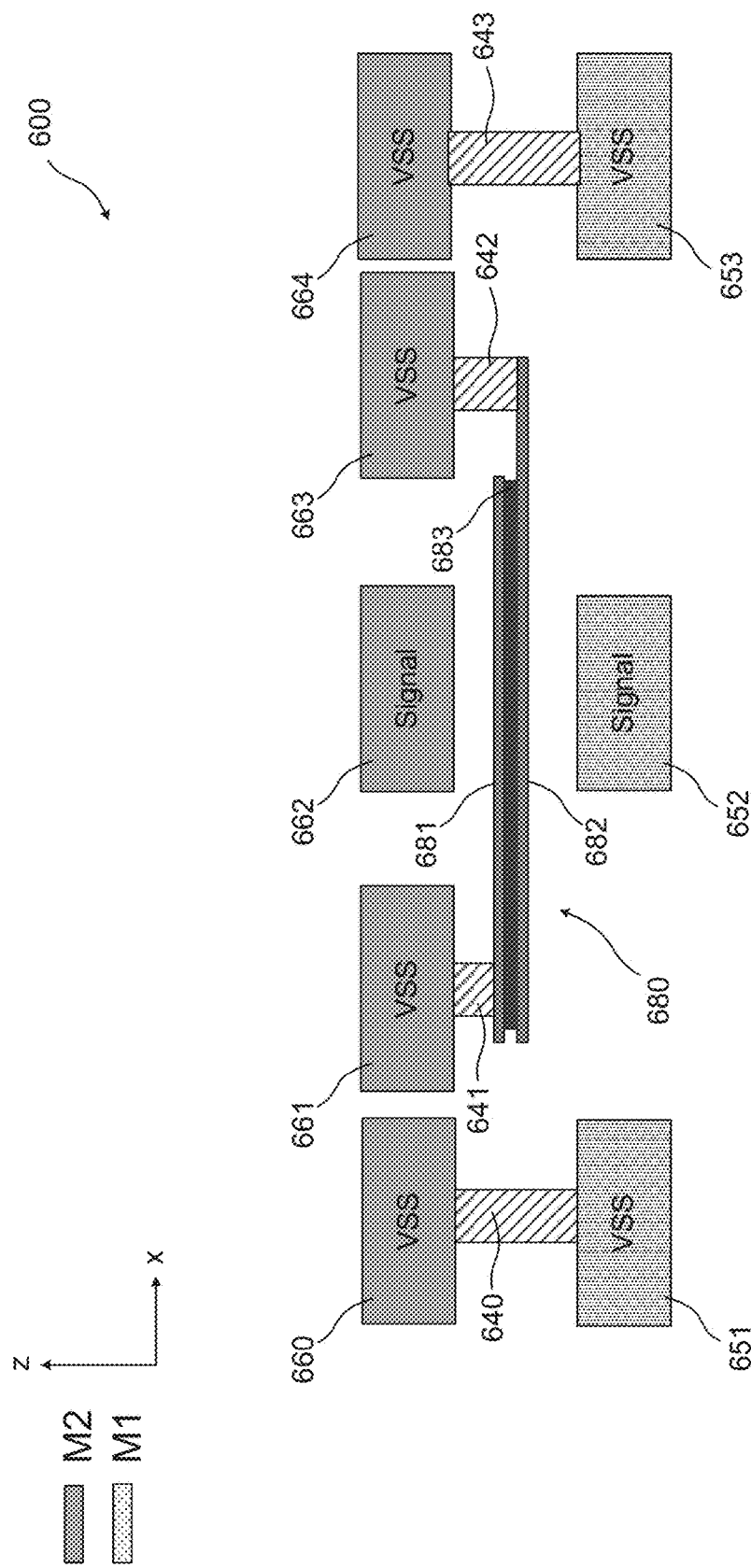

FIG. 6 illustrates a semiconductor structure 600 which includes a shielding MIM capacitor 680 for improved EM shielding for both upper and lower level metallization layers in an interposer structure. Shielding MIM capacitor 680 can be applied to other suitable semiconductor structures where EM shielding for upper and/or lower metallization layers are desired. Semiconductor structure 600 includes: conductive lines 651, 652, and 653 formed in a first metallization layer (e.g., M1 metallization layer of an interposer structure); conductive lines 660, 661, 662, 663, and 664 formed in a second metallization layer (e.g., M2 metallization layer of the interposer structure), shielding MIM capacitor structure 680 including a top capacitor electrode 681, a bottom capacitor electrode 682, and a dielectric layer 683 formed between the two capacitor electrodes, and vias 640, 641, 642, and 643. Via 640 forms an electrical connection between conductive lines 651 and 660. Via 643 forms an electrical connection between conductive lines 653 and 664. As a result, conductive lines 651 and 660 are biased to the same voltage level, while conductive lines 653 and 664 are biased to the same voltage level. For example, conductive lines 651, 660, 653, and 664, can be biased to $V_{SS}$. In some embodiments, conductive lines 661 and 663 are both connected to $V_{SS}$ of the integrated circuit, and the top and bottom capacitor electrodes 681 and 682 are in turn biased to $V_{SS}$ through vias 641 and 642, respectively. In this scenario, shielding MIM capacitor 680's top and bottom capacitor electrodes are biased to the "$V_{SS}/V_{SS}$" configuration. In some embodiments, conductive lines 652 and 662 can be signal lines formed in M1 and M2 metallization layers respectively, and emitting EM signals. In some embodiments, conductive lines can be connected to signal sources and transmit time-varying signals. In some embodiments, conductive lines 652 and 662 can be power lines electrically connected to $V_{DD}$ of the integrated circuit.

Shielding MIM capacitor structure 680 can prevent cross talk (e.g., EM interference) between conductive lines 652 and 662 which allows one or more signal carrying conductive line to be placed over (e.g., directly over) another signal carrying conductive line, providing the benefit of additional routing resources. In addition, conductive lines 651 and 660, as well as conductive lines 653 and 664, provide EM shielding and absorbing capability in the horizontal direction (e.g., x direction). For example, conductive lines 651, 660, 653, and 664 can be set to $V_{SS}$ which absorbs and blocks EM signals propagating in the −x and x directions. As a result, EM signals emitted by conductive lines 652 and 662 can be absorbed and blocked by the conductive lines and shielding MIM capacitor 680.

Figure 7A:
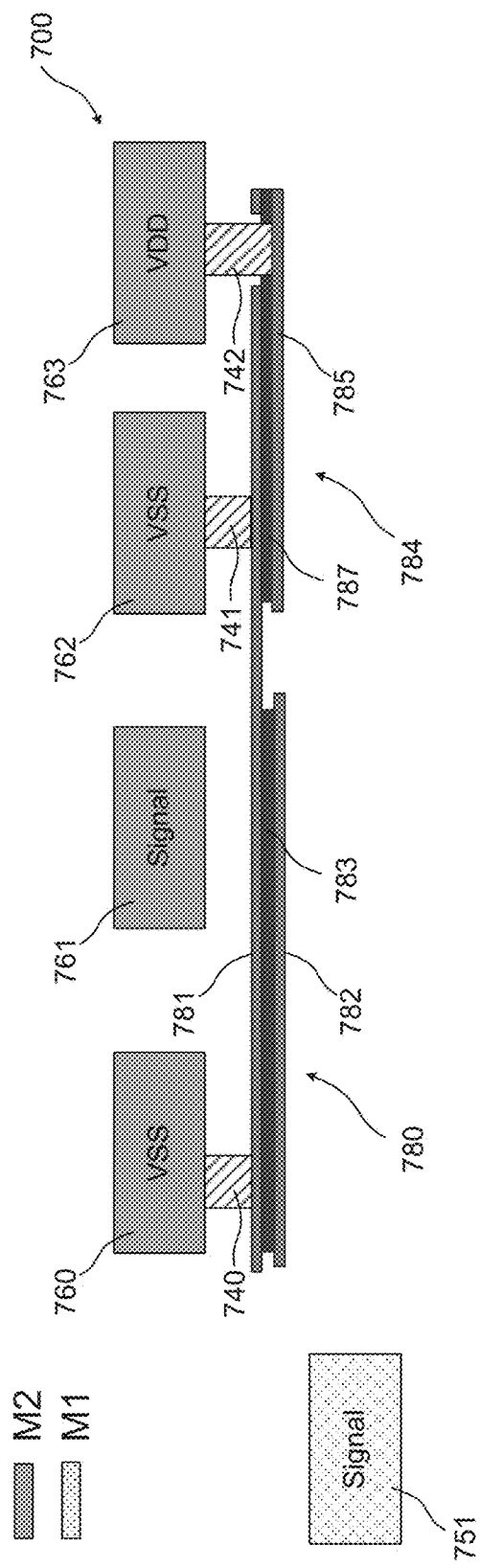
Figure 7B:
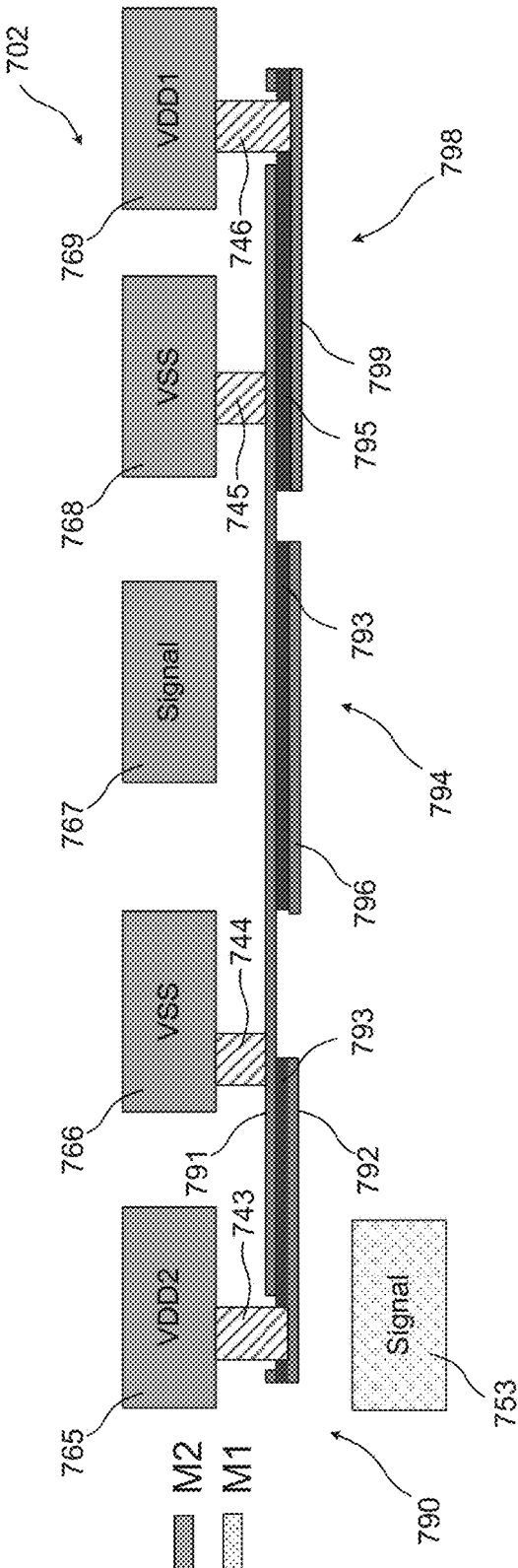

FIGS. 7A-7B respectively illustrate semiconductor structure 700 and 702 which includes configuration of shielding MIM capacitors for improved EM shielding and also providing power integration in the power domain of the integrated circuits, according to some embodiments. FIG. 7A illustrates semiconductor structure 700 with single decoupling capacitor for power integration in the power domain while FIG. 7B illustrates semiconductor structure 702 with double decoupling capacitor for power integration in the power domain. These capacitor configurations can be applied to other suitable semiconductor structures where EM shielding for metallization layers and power integration are desired.

As illustrated in FIG. 7A, semiconductor structure 700 is not only configured to include EM shielding between conductive lines 751 and 761, but also includes a decoupling capacitor for the power domain formed by conductive lines 762 and 763. Semiconductor structure 700 includes: conductive line 751 formed in a first metallization layer (e.g., M1 metallization layer of an interposer structure); conductive lines 760, 761, 762, 763, and 764 formed in a second metallization layer (e.g., M2 metallization layer of an interposer structure); a first shielding MIM capacitor structure 780 including a top capacitor electrode 781, a bottom capacitor electrode 782, and a dielectric layer 783 formed between the two capacitor electrodes; a second shielding MIM capacitor structure 784 sharing a top capacitor electrode 781 with first shielding MIM capacitor structure 780, a bottom capacitor electrode 785, and a dielectric layer 787 formed between the two capacitor electrodes; and vias 740, 741, and 742. Vias 740 and 741 form electrical connections between top capacitor electrode 781 and conductive lines 760 and 762, respectively. Via 742 forms electrical connection between conductive line 763 and bottom capacitor electrode 785. In some embodiments, conductive line 760 is not directly electrically connected to top capacitor electrode 781. In some embodiments, conductive lines 760 and 762 are biased to the same voltage level, for example, $V_{SS}$. In some embodiments, conductive line 763 is connected to $V_{DD}$ of the integrated circuit. Top capacitor electrode 781 is shared by both shielding MIM capacitors 780 and 784.

As shown in FIG. 7A, top capacitor electrode 781 of shielding MIM capacitor 780 is biased to $V_{SS}$ while bottom capacitor electrode 782 is electrically floating. Therefore, similar to semiconductor structure 400 described above in FIG. 4A, shielding MIM capacitor 780 provides enhanced EM shielding between conductive lines 751 and 761. In addition, shielding MIM capacitor 784, which shares a common top capacitor electrode with shielding MIM capacitor 780, also acts as a decoupling capacitor for conductive lines 762 and 763 in the power domain of an interposer structure. As shown in FIG. 7A, bottom capacitor electrode of shielding MIM capacitor 784 is connected to conductive line 763. In some embodiments, conductive line 763 is biased to $V_{DD}$ and therefore shielding MIM capacitor 784 not only shields EM signals emitted from conductive line 761, but also acts as a decoupling capacitor for the power domain. In this scenario, shielding MIM capacitor 780 is biased to the "$V_{SS}$/electrically floating" configuration while shielding MIM capacitor 784 is biased to the "$V_{DD}/V_{SS}$" configuration.

FIG. 7B illustrates semiconductor structure 702 where an additional power domain is included and an additional shielding MIM capacitor is used to provide EM shielding as well as acting as a decoupling capacitor for the additional power domain. Semiconductor structure 702 includes: conductive line 753 formed in a first metallization layer (e.g., M1 metallization layer of an interposer structure); conductive lines 765, 766, 767, 768, and 769 formed in a second metallization layer (e.g., M2 metallization layer of an interposer structure); a first shielding MIM capacitor structure 790 including a top capacitor electrode 791, a bottom capacitor electrode 792, and a dielectric layer 793 formed between the two capacitor electrodes; a second shielding MIM capacitor structure 794 sharing a top capacitor electrode 791 with first shielding MIM capacitor structure 790, a bottom capacitor electrode 796, and a dielectric layer 793 formed between the two capacitor electrodes; a third shielding MIM capacitor structure 798 also sharing a top capacitor electrode 791 with first shielding MIM capacitor structure 790, a bottom capacitor electrode 799, and a dielectric layer 795 formed between the two capacitor electrodes; and vias 743, 744, 745, and 746. Vias 743, 744, 745, and 746 provide electrical connections between respective conductive lines and capacitor electrodes and are not described here in detail for simplicity. Compared to semiconductor structure 700 described above in FIG. 7A, FIG. 7B provides an additional power domain formed by conductive lines 765 and 766. For example, conducting lines 769 and 765 can be electrically connected to $V_{DD1}$ and $V_{DD2}$ respectively. In some embodiments, conducting lines 760 and 762 can be electrically connected to different electrical potentials, respectively. In some embodiments, conducting lines 766 and 768 can be electrically connected to different electrical potentials, respectively. Additional shielding MIM capacitor 790 not only provides EM shielding between conductive lines 767 and 753 and other structures of the semiconductor device, but also serves as a decoupling capacitor for power lines 762 and 763.

Figure 8:
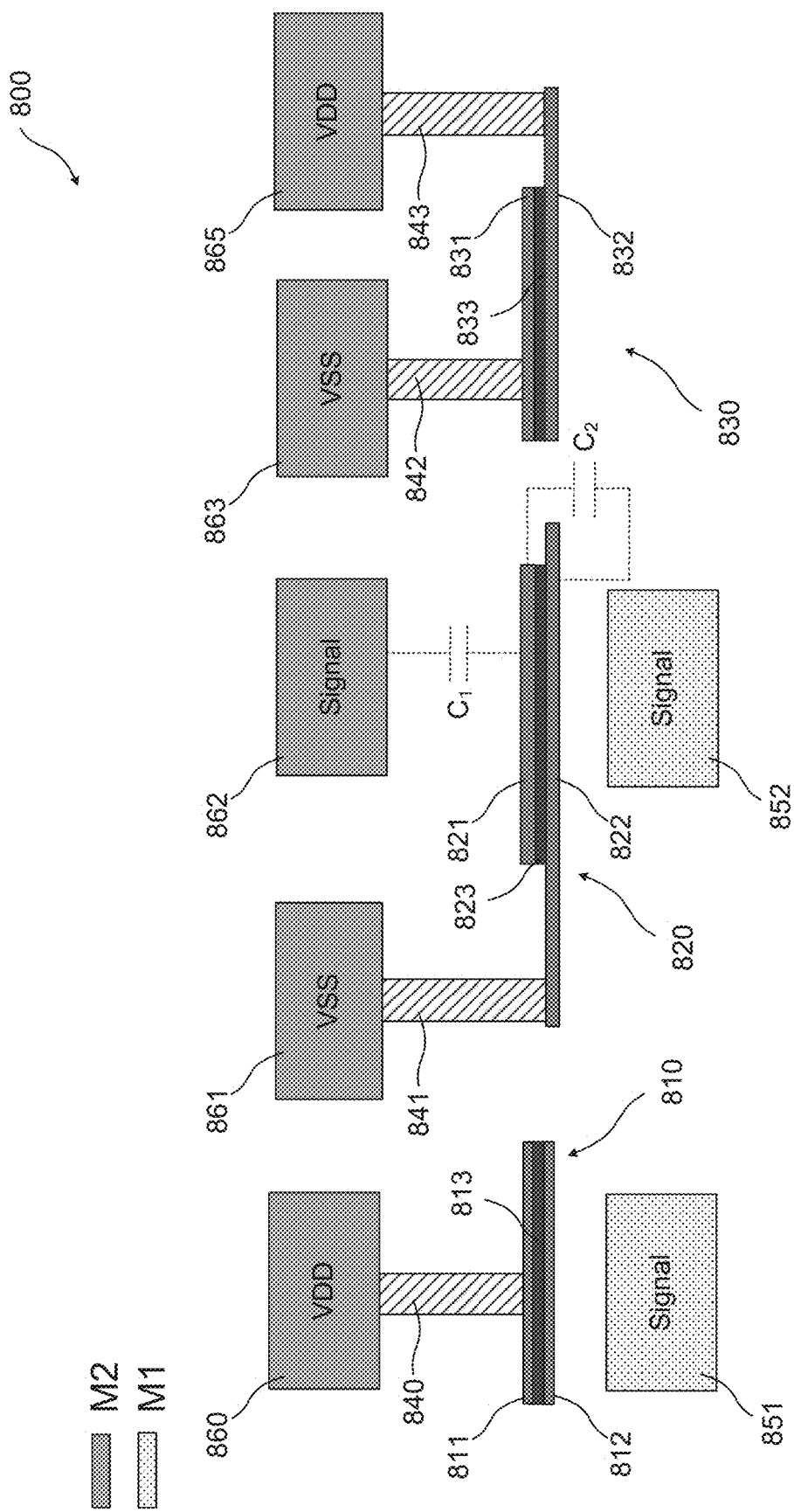

FIG. 8 illustrates a semiconductor structure 800 which includes shielding MIM capacitors for improved EM shielding and also reduced parasitic capacitance in semiconductor devices, according to some embodiments. These capacitor configurations can be applied to other suitable semiconductor structures where EM shielding and parasitic capacitance reduction are desired. By biasing a capacitor electrode to electrically float and the other capacitor electrode to ground and to form two capacitors in series, parasitic capacitances between a conductive line and ground can be reduced.

Semiconductor structure 800 includes: conductive lines 851 and 852 formed in a first metallization layer (e.g., M1 metallization layer of an interposer structure); conductive lines 860, 861, 862, 863, and 864 formed in a second metallization layer (e.g., M2 metallization layer of the interposer structure); a first shielding MIM capacitor structure 810 including a top capacitor electrode 811, a bottom capacitor electrode 812, and a dielectric layer 813 formed between the two capacitor electrodes; a second shielding MIM capacitor structure 820 including a top capacitor electrode 821, a bottom capacitor electrode 822, and a dielectric layer 823 formed between the two capacitor electrodes; a third shielding MIM capacitor structure 830 including a top capacitor electrode 831, a bottom capacitor electrode 832, and a dielectric layer 833; and vias 840, 841, 842, and 843. Vias 840, 841, 842, and 843 provide electrical connections between respective conductive lines and capacitor electrodes and are not described here in detail for simplicity. In some embodiments, conductive lines 861 and 863 can be biased to $V_{SS}$. In some embodiments, conductive lines 860 and 865 are both connected to $V_{DD}$ of the integrated circuit. In some embodiments, conductive lines 851 and 862 are signal carrying lines emitting EM signals. In some embodiments, conductive lines can be connected to signal sources and transmit time-varying signals. Shielding MIM capacitor 810 provides EM shielding between conductive lines 851 and other components of the circuit structure such as conductive lines 860 and 862. Shielding MIM capacitor 830 not only provides EM shielding capability but also serves as a decoupling capacitor for the power domain formed by conductive layers 863 and 865.

The configuration of shielding MIM capacitor 820 provides additional benefits by not only providing EM shielding for conductive line 862, but also reduces the parasitic capacitance between conductive line 862 to ground. As shown in FIG. 8, top capacitor electrode 821 is biased to electrically floating and bottom capacitor electrode 822 is biased to $V_{SS}$ through via 841. As seen from the signal path between conductive line 862 to conductive line 861, a first capacitor $C_1$ (schematically illustrated in FIG. 8 using dotted lines) is induced between conductive line 862 and top capacitor electrode 821, and a second capacitor $C_2$ (schematically illustrated in FIG. 8 using dotted lines) is formed between top and bottom capacitor electrodes 821 and 822. The first and second capacitors $C_1$ and $C_2$ are connected in series. The total capacitance $$C_{total} = \frac{C_1 * C_2}{C_1 + C_2}$$

is less than either $C_1$ or $C_2$. Therefore, by inserting shielding MIM capacitor 820 between conductive lines 861 and 862, EM shielding is improved and parasitic capacitance between conductive lines and ground is reduced. In addition, because shielding MIM capacitor 820 provides enhanced EM shielding, conductive line 852 can be placed under (e.g., directly under) conductive line 862 without introducing (or with minimal) cross talk or interference.

In some embodiments, conductive lines 852 and 862 can be signal lines formed in M1 and M2 metallization layers, respectively, and emit EM signals. In some embodiments, conductive lines 860 and 865 can be power lines electrically connected to $V_{DD}$ of the integrated circuit. Shielding MIM capacitor structure can prevent cross talk (e.g., EM interference) between conductive lines 852 and 862 which allows one or more signal carrying conductive lines to be placed over (e.g., directly over) another signal carrying conductive line. In addition, conductive lines 861 and 863 provide EM shielding and absorbing capability in the horizontal direction (e.g., x direction). For example, conductive lines 861 and 863 can be set to $V_{SS}$ which absorbs and blocks EM signals propagating in the −x and x directions. As a result, EM signals emitted by conductive lines 865 can be absorbed and blocked by the conductive lines and shielding MIM capacitor.

Figure 9A:
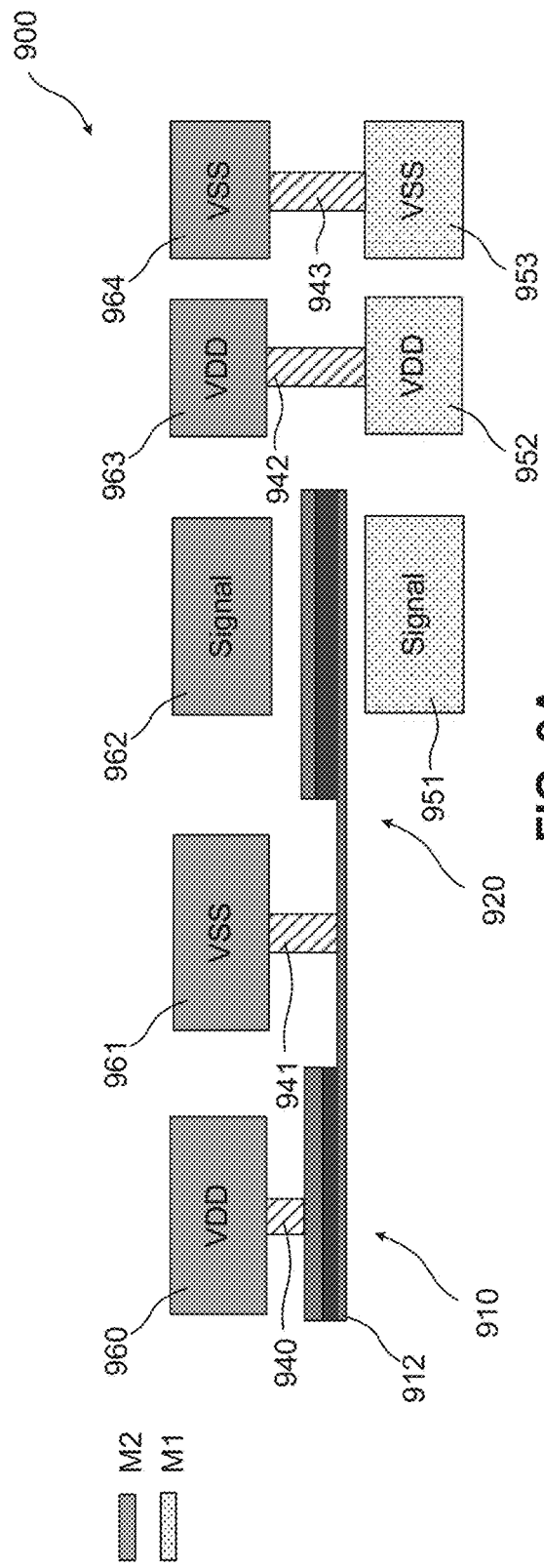
Figure 9B:
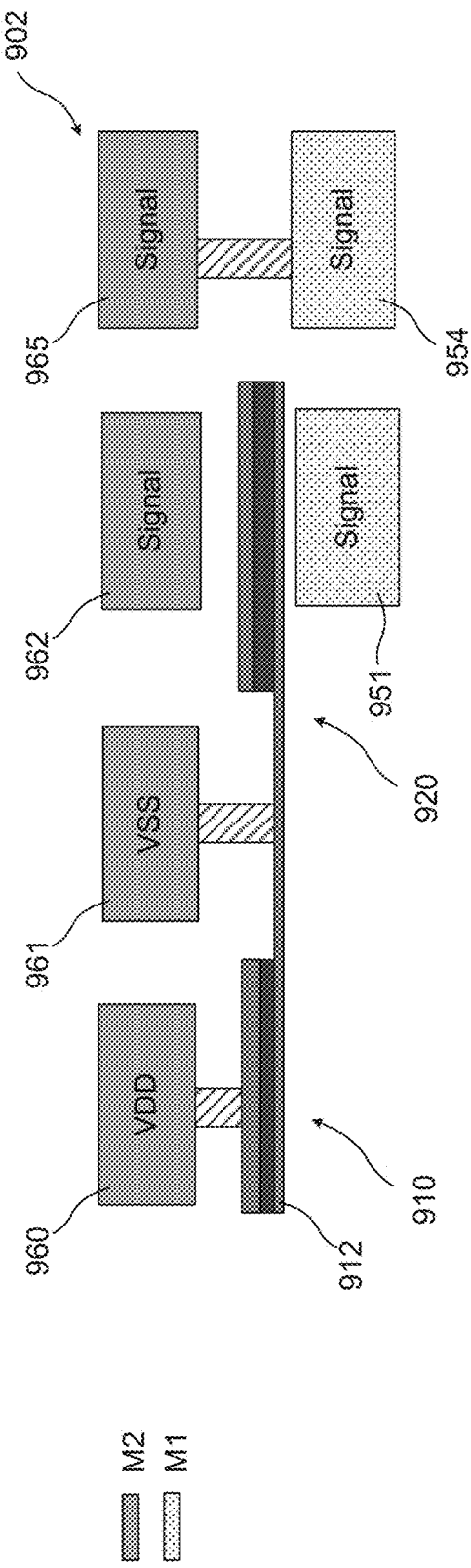

FIGS. 9A-9B respectively illustrate semiconductor structure 900 and 902 which includes configuration of shielding MIM capacitors that provide improved EM shielding performance, DC performance, and reduction in electromigration that in turn improves the lifetime of conducting lines and the overall reliability of the devices. First, induced capacitor $C_1$ and shielding MIM capacitor $C_2$ described above in FIG. 8 can also absorb induced current ripples caused by adjacent power line and/or signal lines and reduce electrical shocks on conducting lines. As a result, the lifetime of conducting lines can be improved. Second, shielding MIM capacitors can also reduce electromigration in conducting lines which in turn improves their lifetime. Electromigration is the movement of conducting material in conductive lines due to high current density, and can eventually cause breaks in conducting lines. Because shielding MIM capacitors provide enhanced EM shielding capability, conductive lines can be placed under (e.g., directly under) other conductive lines and separated by a shielding MIM capacitor. Therefore, more routing resources can be freed and used for other devices. For example, power or signal lines that are originally formed in only one metallization layer can be formed in more than two metallization layers, therefore reducing current densities in conductive lines. Reduced current density provides less current induced in adjacent conductive lines and in turn reduces electromigration. Reduced current density in a conducting line also reduces the conducting line's own electromigration and results in enhanced device reliability.

FIG. 9A illustrates a semiconductor structure 900 which includes shielding MIM capacitor structures for improved EM shielding and improved device reliability by improving DC performance and reducing electromigration. Semiconductor structure 900 includes: conductive lines 951, 952, and 953 formed in a first metallization layer (e.g., M1 metallization layer of an interposer structure); conductive lines 960, 961, 962, 963, and 964 formed in a second metallization layer (e.g., M2 metallization layer of the interposer structure); a first shielding MIM capacitor structure 910 and a second shielding MIM capacitor structure 920 sharing a common bottom capacitor electrode 912; and vias 940, 941, 942, and 943. Vias 940, 941, 942, and 943 provide electrical connections between respective conductive lines and capacitor electrodes and are not described here in detail for simplicity. In some embodiments, conductive lines 961 and 964 can be biased to $V_{SS}$. In some embodiments, conductive lines 960 and 963 are both connected to $V_{DD}$. In some embodiments, conductive lines 951 and 962 are signal carrying lines emitting EM signals. Shielding MIM capacitor 910 provides EM shielding between conductive lines 951 and other components of the circuit structure. Shielding MIM capacitor 910 not only provides EM shielding capability but also serves as decoupling capacitor for the power domain formed by conductive layers 960 and 961.

Similar to the induced capacitor $C_1$ described above in FIG. 8, conducting line 962 and shielding MIM capacitor 920 can also form an induced capacitor to improve DC performance and reduce electromigration. By incorporating shielding MIM capacitor 920, routing space under (e.g., directly under) conducting line 962 can be utilized. For example, conducting line 951 can be formed under (e.g., directly under) conducting line 962, which in turn frees up routing space to the right of conducting lines 951 and 962 for other devices or structures. For example, conducting lines 952, 953, 963, and 964 can be formed utilizing the routing space in both M1 and M2 metallization layers. By connecting conducting lines 952 and 963, the current density in each wire can be less compared to transmitting power through a single wire. As described above, conducting lines 952 and 963 are connected through via 942, while conducting lines 964 and 953 are connected through via 943. In some embodiments, conducting lines can also be signal carrying lines, such as conducting line 954 and 965 illustrated in semiconductor structure 902 of FIG. 9B.

Figure 10:
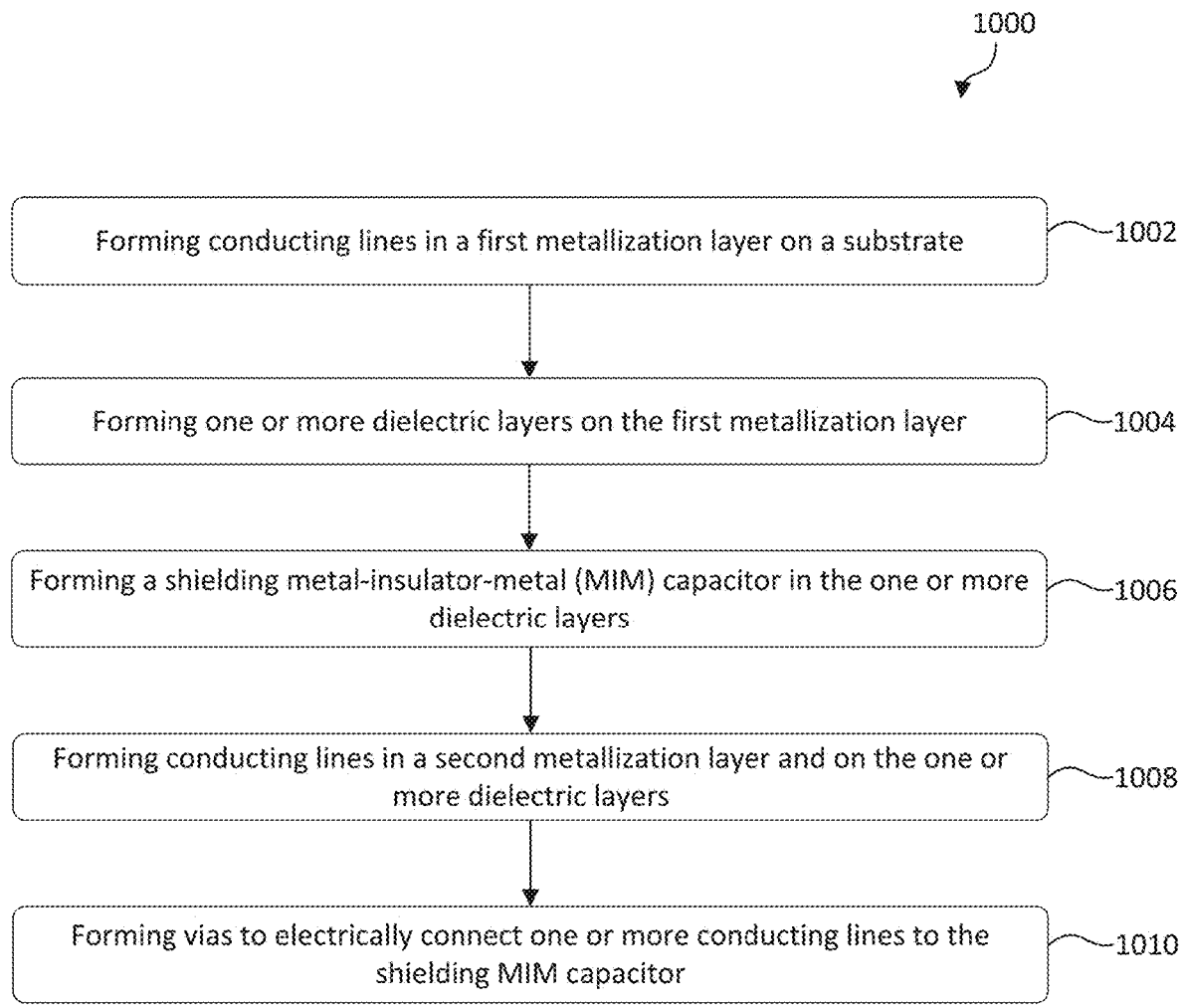
FIG. 10 is an illustration of a method for integrated circuit components placement flow, in accordance with some embodiments.

FIG. 10 is an illustration of a method 1000 for forming various shielding MIM capacitors in semiconductor structures, according to some embodiments. Operations of method 1000 can be performed in a different order and/or vary. Variations of method 1000 are within the scope of the present disclosure.

Method 1000 begins at operation 1002 by forming a first metallization layer on a substrate and forming conducting lines in the first metallization layer, according to some embodiments. In some embodiments, a first metallization layer can be blanket deposited on the substrate, and at least a portion of the first metallization layer is patterned to form conducting lines. In some embodiments, a dielectric layer is deposited on the substrate and patterned to form trenches, and conducting material is deposited into the trenches to form conducting lines. Conducting lines can be formed using conductive materials such as, for example, copper, aluminum, tungsten, silver, cobalt, metal silicides, highly-conductive tantalum nitride, other suitable metal or metal alloys, and/or combinations thereof. In some embodiments, the first metallization layer can be a metal 1 layer (i.e., M1) of a back-end-of-line (BEOL) interconnect structure. The M1 metal layer is provided here as an example and in some embodiments, conducting lines can be formed in other metallization layers. In some embodiments, the first metallization layer can be other metal layers of a BEOL structure. Conducting lines can be used to provide electrical connection to passive devices such as capacitors, bumps, or connected to active devices such as one or more device terminals (e.g., gate structures and source/drain structures of semiconductor devices). In some embodiments, the first metallization layer can be formed using any suitable deposition process such as, for example, physical vapor deposition (PVD), atomic layer deposition (ALD), molecular beam epitaxy (MBE), high density plasma chemical vapor deposition (HDPCVD), metal organic CVD (MOCVD), remote plasma CVD (RPCVD), plasma-enhanced CVD (PECVD), electroplating, electroless plating, other suitable methods, and/or combinations thereof. A patterning process of the first metallization layer to form conducting lines can include photolithography and etch processes. The photolithography process can include forming a photoresist layer overlying the deposited first metallization layer, exposing the resist to a pattern, performing post-exposure bake processes, and developing the resist to form a masking element including the resist. The masking element can then be used to protect regions of the first metallization layer while an etch process removes exposed metallization material and forming conducting lines. The etch process can be a reactive ion etch (RIE) or any other suitable process. Examples of the first metallization layer can be M1 layers described in FIGS. 4A-9B.

In operation 1004, one or more dielectric layers are formed on the first metallization layer, according to some embodiments. One or more dielectric layers can be formed on the substrate and the first metallization layer including the conducting lines. The one or more dielectric layers can also fill openings formed in the first metallization layer. In some embodiments, a dielectric layer of the one or more dielectric layers is substantially coplanar with top surfaces of the first metallization layer. The one or more dielectric layers can be formed using any suitable dielectric material such as, for example, silicon oxide, spin-on-glass, $SiN_x$, silicon oxynitride, FSG, a low-k dielectric material, any other suitable insulating material, or combinations thereof. In some embodiments, the dielectric layers can be formed using any suitable deposition process such as, for example, PVD, ALD, MBE, HDPCVD, MOCVD, RPCVD, PECVD, other suitable methods, and/or combinations thereof. Examples of one or more dielectric layers can be insulating material layer 122b described above in FIG. 1.

In operation 1006, a shielding MIM capacitor is formed in the one or more dielectric layers, according to some embodiments. A bottom capacitor electrode can be formed in the one or more dielectric layers. The process for forming a bottom capacitor electrode can include, but is not limited to, depositing another dielectric layer of the one or more dielectric layers, patterning and etching the another dielectric layer to form trenches, depositing conducting material in the trenches, performing a planarization process (e.g., a chemical mechanical polishing (CMP) process) such that top surfaces of the deposited conducting material and the another dielectric layer is substantially coplanar. The deposition and patterning process can be similar to the deposition processes described above in operation 1002 and 1004. The patterning process can form a bottom capacitor electrode with nominal dimensions. For example, a bottom capacitor electrode can be formed similar to bottom capacitor electrodes of shielding MIM capacitors 300 and 302 described in FIGS. 3A and 3B, and bottom capacitor electrodes 282, 482, 582, 682, 782, 785, 792, 796, 799, 812, 822, 832, and 912, described above in FIGS. 2-9B.

Formation of the shielding MIM capacitor further includes forming a capacitor dielectric on the bottom capacitor electrode. Forming the capacitor dielectric can include, but is not limited to, blanket depositing a capacitor dielectric material, patterning and etching the deposited capacitor dielectric material, and performing a planarization process (e.g., a CMP process). The capacitor dielectric material can be formed using silicon nitride, silicon oxide, hafnium oxide, other suitable dielectric material, and/or combinations thereof. In some embodiments, the capacitor dielectric material can be formed using any suitable high-k material (e.g., material with a dielectric constant greater than 3.9). The capacitor dielectric material can be formed using any suitable deposition method. For example, the capacitor dielectric material can be deposited using methods similar to the deposition of the one or more dielectric layers above in operation 1004. Examples of the capacitor dielectric layer can be dielectric layers 283, 483, 583, 683, 783, 813, 823, and 833, described above in FIGS. 2-8. Examples of the capacitor dielectric layer can also be capacitor dielectrics in shielding MIM capacitor 910 described in FIGS. 9A and 9B.

A top capacitor electrode can be formed on the capacitor dielectric layer. The process for forming the top capacitor electrode can be similar to the process for forming the bottom capacitor electrode and is not described in detail here for simplicity. Examples of top capacitor electrodes can be top capacitor electrodes 281, 481, 581, 681, 781, 791, 811, 821, 831, and top capacitor electrodes of shielding MIM capacitor 910, described above in FIGS. 2-9B. After the top capacitor electrode is formed, dielectric layers can be formed on the shielding MIM capacitor and a planarization process can be performed. These dielectric layers can be a portion of the one or more dielectric layers described above in operation 1004.

In operation 1008, a second metallization layer is blanket deposited on the substrate, and at least a portion of the second metallization layer is patterned to form conducting lines, according to some embodiments. In some embodiments, a dielectric layer is deposited on the one or more dielectric layers of operation 1004 and patterned to form trenches. Conducting material is then deposited into the trenches to form conducting lines in the second metallization layer. Processes for forming the second metallization layer can be similar to processes used to form the first metallization layer described above in operation 1002 and are not described in detail here for simplicity. In structures where the first metallization layer is an M1 metallization layer, the second metallization layer can be an M2 metallization layer or other metallization layers above the M1 metallization layer. In some embodiments, the second metallization layer can be any metallization layers above the first metallization layer. For example, the second metallization layer can be M3, M4, M5 metallization layers of a semiconductor structure. Examples of second metallization layer can be M2 layers described in FIGS. 4A-9B.

In operation 1010, vias can be formed to electrically connect one or more conducting lines to the shielding MIM capacitor, according to some embodiments. Openings are formed in dielectric materials and subsequently filled with conductive material to form vias that connect capacitor electrodes to various components of the semiconductor structures. Using an etching mask, etching processes can be performed on exposed one or more dielectric layers to form openings. The etching processes can be dry etching processes such as, for example, an RIE and/or other suitable processes. In some embodiments, the etching processes can be wet chemical etching processes. In some embodiments, multiple layers of dielectric material need to be removed and one or more etching processes may be needed, where each process can be selected for etching a specific type of dielectric material. In some embodiments, the etching process can continue until the desired metallization layers are exposed.

The formed openings are then filled with conductive material, according to some embodiments. In some embodiments, conductive materials can be formed using copper, tungsten, cobalt, aluminum, other suitable metals, and/or combinations thereof. In some embodiments, the conductive materials deposited in each opening or trench can be the same. In some embodiments, different conductive materials can be deposited into different trenches. In some embodiments, any suitable deposition process can be used such as, for example, ALD, MBE, HDPCVD, MOCVD, RPCVD, PECVD, electroplating, electroless plating, other suitable methods, and/or combinations thereof. In some embodiments, after the openings are filled with conductive material, a planarization process (e.g., a CMP process) can be used to remove excessive conductive material and planarize the top surfaces of the vias and one or more dielectric layers. In some embodiments, a capacitor electrode can be electrically connected to a ground level. In some embodiments, a capacitor electrode can be electrically connected to an electrical floating level. For example, top and bottom capacitor electrodes can be respectively electrically connected to a ground level and an electrical floating level, such as the shielding MIM capacitor configuration described in FIGS. 4A and 4B. In some embodiments, both the top and bottom capacitor electrodes are connected to a ground level, such as the shielding MIM capacitor configuration described in FIG. 6.

The preset disclosure also provides a computer-readable storage medium encoded with a computer program to be executed by a computer to design a semiconductor device. The program instructions on the computer-readable storage medium provide for carrying out the execution of floor-planning, placement, and routing of shielding MIM capacitors, insertion of vias and conducting lines, and placement and routing of interconnected components of the semiconductor device. The operations in the design of a semiconductor device incorporating shielding MIM capacitors can be implemented in a wide variety of configurations and architectures. Therefore, some or all of the operations in the design and implementation of the shielding MIM capacitor can be performed in hardware, in software or both.

First, information can be provided to the computer-aided design (CAD) layout system. Design netlist is provided along with design information on shielding MIM capacitors, conducting lines, and other components of an interposer structure. This data is input to the CAD tool, which may be an automatic place and route (APR) tool according to some embodiments. Various other suitable CAD tools can also be used. The data is forwarded into a data receiving unit and temporarily stored on a memory device. The design netlist may include design information on interconnected active components of a semiconductor device which may be an integrated circuit or other semiconductor device. The information on conducting lines can include locations of conducting lines, voltages supplied to the conducting lines, the type and frequency of signals carried in the conducting lines, the strength of EM signals emitted by the conducting lines, dimensions of the conducting lines, and any other suitable information.

A layout design system that implements the APR process scans the circuit layout design to determine conducting lines that need to be shielded. In some embodiments, the conductive lines in various metallization layers are checked, and signal or power lines with undesirably high EM signal emission are selected to be shielded. In some embodiments, the conducting lines for standard cells are selected according to certain criteria, e.g., threshold for comparing the EM emission of a conductive line.

A layout design system implementing the APR process can identify the power lines, ground lines, conducting lines, available routing spaces, connections of different structures and arrange them such that conducting lines requiring EM shielding can be identified and shielding MIM capacitors can be inserted and arranged.

The shielding MIM capacitor circuit design and/or implementation process described above can be carried out by method 1100 of FIG. 11 and exemplary computer system 1200 of FIG. 12, as described below.

Figure 11:
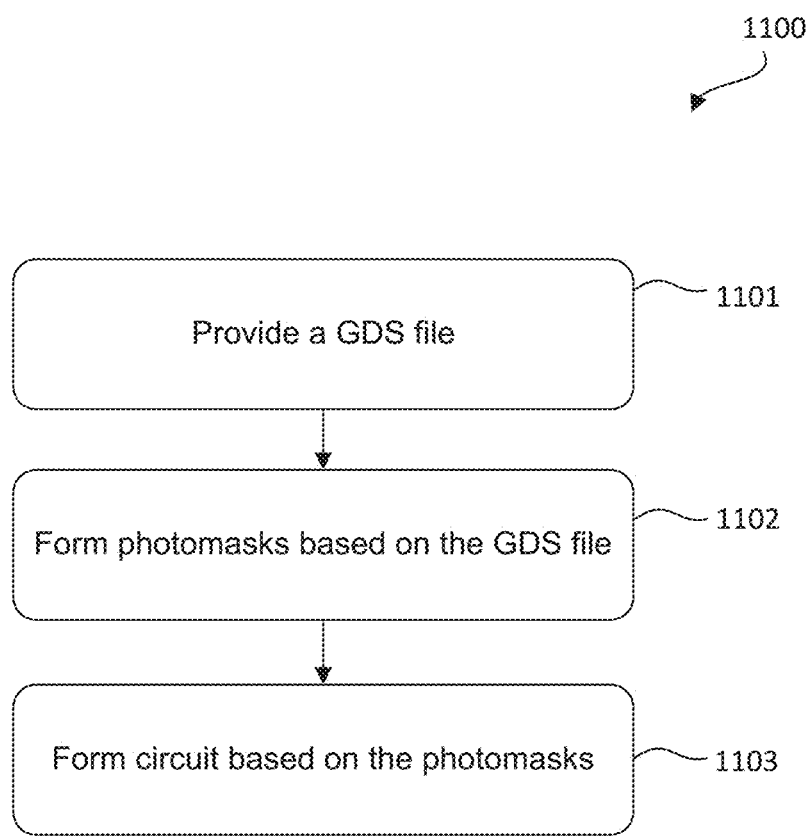
FIG. 11 is an illustration of an exemplary computer system for implementing various embodiments of the present disclosure, in accordance with some embodiments.

FIG. 11 is an illustration of an exemplary method 1100 for circuit fabrication, according to some embodiments. Operations of method 1100 can also be performed in a different order and/or vary. Variations of method 1100 should also be within the scope of the present disclosure.

In operation 1101, a GDS file is provided. The GDS file can be generated by an EDA tool and include the standard cell structures that have already been optimized using the disclosed method. The operation depicted in 1101 can be performed by, for example, an EDA tool that operates on a computer system, such as computer system 1100 described above.

In operation 1102, photomasks are formed based on the GDS file. In some embodiments, the GDS file provided in operation 1101 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 1102 can be performed by a photomask manufacturer, where the circuit layout is read using a suitable software (e.g., EDA tool) and the circuit layout is transferred onto a substrate using a suitable printing/deposition tool. The photomasks reflect the circuit layout/features included in the GDS file.

In operation 1103, one or more circuits are formed based on the photomasks generated in operation 1102. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

Figure 12:
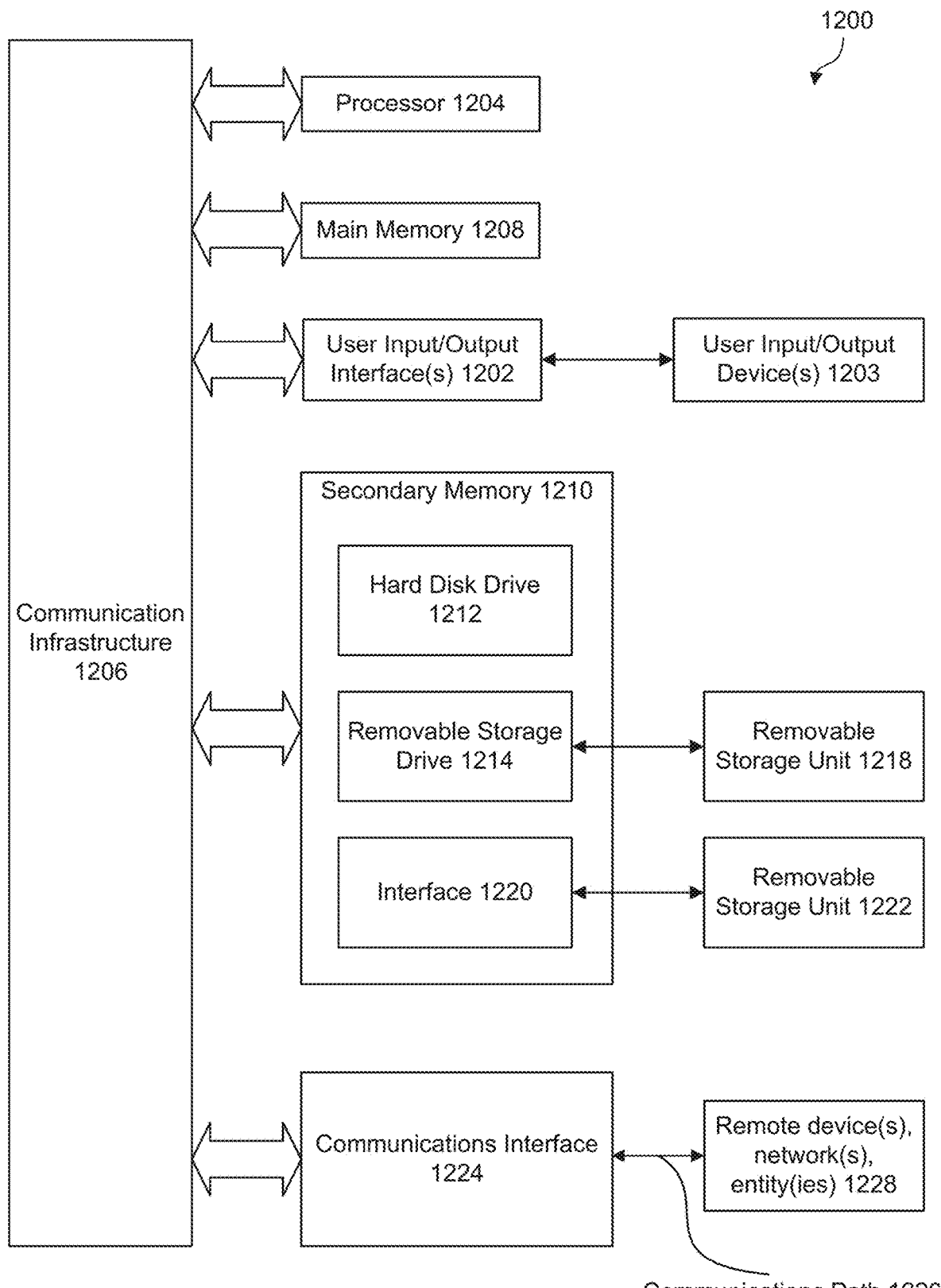
FIG. 12 is an illustration of a process to form circuit layouts based on a graphic database system (GDS) file, in accordance with some embodiments.

FIG. 12 is an illustration of an exemplary computer system 1200 in which various embodiments of the present disclosure can be implemented, according to some embodiments. Computer system 1200 can be any well-known computer capable of performing the functions and operations described herein. For example, and without limitation, computer system 1200 can be capable of performing planning, routing, and placing integrated circuit components in semiconductor device design. Computer system 1200 can be used, for example, to execute one or more operations in method 1100 and the designing processes of shielding MIM capacitor devices.

Computer system 1200 includes one or more processors (also called central processing units, or CPUs), such as a processor 1204. Processor 1204 is connected to a communication infrastructure or bus 1206. Computer system 1200 also includes input/output device(s) 1203, such as monitors, keyboards, pointing devices, etc., that communicate with communication infrastructure or bus 1206 through input/output interface(s) 1202. An EDA tool can receive instructions to implement functions and operations described herein—e.g., method 1100 of FIG. 11—via input/output device(s) 1203. Computer system 1200 also includes a main or primary memory 1208, such as random access memory (RAM). Main memory 1208 can include one or more levels of cache. Main memory 1208 has stored therein control logic (e.g., computer software) and/or data. In some embodiments, the control logic (e.g., computer software) and/or data can include one or more of the operations described above with respect to method 1100 of FIG. 11.

Computer system 1200 can also include one or more secondary storage devices or memory 1210. Secondary memory 1210 can include, for example, a hard disk drive 1212 and/or a removable storage device or drive 1214. Removable storage drive 1214 can be a floppy disk drive, a magnetic tape drive, a compact disk drive, an optical storage device, tape backup device, and/or any other storage device/drive.

Removable storage drive 1214 can interact with a removable storage unit 1218. Removable storage unit 1218 includes a computer usable or readable storage device having stored thereon computer software (control logic) and/or data. Removable storage unit 1218 can be a floppy disk, magnetic tape, compact disk, DVD, optical storage disk, and/any other computer data storage device. Removable storage drive 1214 reads from and/or writes to removable storage unit 1218.

According to some embodiments, secondary memory 1210 can include other means, instrumentalities or other approaches for allowing computer programs and/or other instructions and/or data to be accessed by computer system 1200. Such means, instrumentalities or other approaches can include, for example, a removable storage unit 1222 and an interface 1220. Examples of the removable storage unit 1222 and the interface 1220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1210, removable storage unit 1218, and/or removable storage unit 1222 can include one or more of the operations described above with respect to method 1100 of FIG. 11.

Computer system 1200 can further include a communication or network interface 1224. Communication interface 1224 enables computer system 1200 to communicate and interact with any combination of remote devices, remote networks, remote entities, etc. (individually and collectively referenced by reference number 1228). For example, communication interface 1224 can allow computer system 1200 to communicate with remote devices 1228 over communications path 1226, which can be wired and/or wireless, and which can include any combination of LANs, WANs, the Internet, etc. Control logic and/or data can be transmitted to and from computer system 1200 via communication path 1226.

The operations in the preceding embodiments can be implemented in a wide variety of configurations and architectures. Therefore, some or all of the operations in the preceding embodiments—e.g., method 1100 of FIG. 11—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 1200, main memory 1208, secondary memory 1210 and removable storage units 1218 and 1222, as well as tangible articles of manufacture embodying any combination of the foregoing. Such control logic, when executed by one or more data processing devices (such as computer system 1200), causes such data processing devices to operate as described herein. In some embodiments, computer system 1200 is installed with software to perform operations in the manufacturing of photomasks and circuits, as illustrated in method 1200 of FIG. 12 (described below). In some embodiments, computer system 1200 includes hardware/equipment for the manufacturing of photomasks and circuit fabrication. For example, the hardware/equipment can be connected to or be part of element 1228 (remote device(s), network(s), entity(ies)) of computer system 1200

Various embodiments in accordance with this disclosure provides mechanisms of forming a shielding MIM capacitor structure to provide EM shielding for EM emissions in semiconductor devices. In some embodiments, shielding MIM capacitor can mitigate power line current ripple or decouple one circuit component from another component of an electrical circuit structure such as an interposer structure. Shielding MIM capacitors includes parallel conductive plates that can act as Faraday shields to shield devices and structures from EM emission source and prevent EM interference in other circuit components, such as devices formed on another die or other components coupled to the interposer structure. Without using additional mask layers, the shielding MIM capacitor structure can be incorporated into decoupling capacitors for power/ground supplies to eliminate routing penalty and minimize the device footprint. In accordance with some embodiments of this disclosure, the shielding MIM capacitor structure provides, among other things, benefits of: (i) improved power, performance, area (PPA) design by strategically placing shielding MIM capacitors between metal layers to serve as a shielding capacitor, a decoupling capacitor, or both; (ii) compatibility with current layout design and process flow without the need for additional masks; and (iii) diverse EM shielding protection in vertical direction for upper/lower metallization layers and horizontal direction for adjacent structures.

In some embodiments, a semiconductor interposer device includes a substrate and a first metallization layer formed on the substrate. A first dielectric layer is formed on the first metallization layer and a second metallization layer is formed on the substrate. A first conducting line is formed in the first metallization layer and second and third conducting lines are formed in the second metallization layer. A MIM capacitor is formed in the first dielectric layer and over the first conducting line. The MIM capacitor includes (i) a top capacitor electrode in the first dielectric layer and electrically coupled to the second conducting line; (ii) a bottom capacitor electrode in the first dielectric layer and above the first conducting line, wherein the bottom capacitor electrode is configured to be electrically floating; and (iii) a second dielectric layer between the top and bottom capacitor electrodes.

In some embodiments, a semiconductor interposer device includes a substrate and a first metallization layer formed on the substrate. The semiconductor interposer device also includes a first dielectric layer formed on the first metallization layer and a second metallization layer formed on the substrate. A first conducting line is formed in the first metallization layer and second, third, and fourth conducting lines are formed in the second metallization layer. The third conducting line is between the second and fourth conducting lines. The semiconductor interposer device also includes a MIM capacitor formed in the first dielectric layer and over the first conducting line. The MIM capacitor includes (i) a top capacitor electrode in the first dielectric layer and electrically coupled the second conducting line; (ii) a bottom capacitor electrode in the first dielectric layer and above the first conducting line, the bottom capacitor electrode electrically coupled to the fourth conducting line; and (iii) a second dielectric layer between the top and bottom capacitor electrodes.

In some embodiments, a method of forming a semiconductor structure includes providing a substrate and forming a first conducting line in a first metallization layer on the substrate. The method also includes depositing a first dielectric layer on the first metallization layer and forming a metal-insulator-metal (MIM) capacitor in the first dielectric layer and over the first conducting line. Forming the MIM capacitor includes (i) depositing first and second capacitor electrodes in the first dielectric layer and above the first conducting line; (ii) depositing a second dielectric layer between the first and second capacitor electrodes; (iii) electrically coupling the first capacitor electrode to a ground voltage level; and (iv) electrically coupling the second capacitor electrode to an electrically floating level or the ground voltage level. The method further includes forming a second conducting line on the first dielectric layer and in a second metallization layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor interposer device, comprising:
    a substrate;
    a first metallization layer formed on the substrate;
    a first dielectric layer formed on the first metallization layer;
    a second metallization layer formed over the first metallization layer;
    a first conducting line formed in the first metallization layer;
    second and third conducting lines formed in the second metallization layer; and
    a metal-insulator-metal (MIM) capacitor formed in the first dielectric layer and over the first conducting line, the MIM capacitor comprising:
        a top capacitor electrode in the first dielectric layer;
        a bottom capacitor electrode in the first dielectric layer and above the first conducting line, wherein the top and bottom capacitor electrodes are electrically coupled to a ground voltage supply level; and
        a second dielectric layer between the top and bottom capacitor electrodes, and wherein:
            a top surface of the second dielectric layer is in physical contact with a bottom surface of the top capacitor electrode; and
            a bottom surface of the second dielectric layer is in physical contact with a top surface of the bottom capacitor electrode.

2. The semiconductor interposer device of claim 1, wherein the first conducting line comprises a signal carrying line.

3. The semiconductor interposer device of claim 1, wherein the second conducting line is electrically coupled to a ground source.

4. The semiconductor interposer device of claim 1, wherein surface areas of the top and bottom capacitor electrodes are different.

5. The semiconductor interposer device of claim 1, wherein the third conducting line comprises a signal carrying line.

6. The semiconductor interposer device of claim 5, wherein the third conducting line is above the top capacitor electrode.

7. The semiconductor interposer device of claim 1, wherein the first and second dielectric layers comprise low-k and high-k dielectric materials, respectively.

8. The semiconductor interposer device of claim 1, further comprising a fourth conducting line formed in the second metallization layer, wherein the fourth conducting line is electrically coupled to a ground source and to the top capacitor electrode.

9. The semiconductor interposer device of claim 1, wherein the first metallization layer is an M1 metallization layer.

10. The semiconductor interposer device of claim 1, wherein the second metallization layer is an M2 metallization layer.

11. A semiconductor device, comprising:
a substrate;
a first metallization layer formed on the substrate;
a first dielectric layer formed on the first metallization layer;
a second metallization layer formed over the first metallization layer;
a first conducting line formed in the first metallization layer;
second, third, and fourth conducting lines formed in the second metallization layer, wherein the third conducting line is between the second and fourth conducting lines; and
a metal-insulator-metal (MIM) capacitor formed in the first dielectric layer and over the first conducting line, the MIM capacitor comprising:
a top capacitor electrode in the first dielectric layer and electrically coupled to a ground source;
a bottom capacitor electrode in the first dielectric layer and above the first conducting line, wherein the bottom capacitor electrode is electrically coupled to the ground source; and
a second dielectric layer between the top and bottom capacitor electrodes, and wherein:
a top surface of the second dielectric layer is in physical contact with a bottom surface of the top capacitor electrode; and
a bottom surface of the second dielectric layer is in physical contact with a top surface of the bottom capacitor electrode.

12. The semiconductor device of claim 11, wherein the first conducting line comprises a signal carrying line configured to emit electromagnetic signals.

13. The semiconductor device of claim 11, wherein the second and fourth conducting lines are electrically coupled to a ground source.

14. The semiconductor device of claim 11, wherein the third conducting line comprises a signal carrying line.

15. The semiconductor device of claim 14, wherein the third conducting line is above the top capacitor electrode.

16. A semiconductor device, comprising:
a first conducting line in a first metallization layer of a back-end-of-line (BEOL) interconnect structure;
a metal-insulator-metal (MIM) capacitor formed in a first dielectric layer, the MIM capacitor comprising:
a top capacitor electrode;
a bottom capacitor electrode directly over the first conducting line, wherein the top and bottom capacitor electrodes are electrically coupled to a ground voltage supply; and
a second dielectric layer between the top and bottom capacitor electrodes, and wherein:
a top surface of the second dielectric layer is in physical contact with a bottom surface of the top capacitor electrode; and
a bottom surface of the second dielectric layer is in physical contact with a top surface of the bottom capacitor electrode; and
a second conducting line above the first dielectric layer and in a second metallization layer of the BEOL interconnect structure.

17. The semiconductor device of claim 16, wherein the first conducting line comprises a signal carrying line.

18. The semiconductor device of claim 16, wherein the second conducting line comprises a signal carrying line.

19. The semiconductor device of claim 16, wherein the first and second conducting lines are coupled to a source power line and a ground voltage reference line, respectively.

20. The semiconductor device of claim 16, further comprising third and fourth conducting lines formed in the second metallization layer, wherein:
the second conducting line is formed between the third and fourth conducting lines; and
the third and fourth conducting lines are coupled to the ground voltage supply.

\* \* \* \* \*